United States Patent
Satoh et al.

(10) Patent No.: US 8,633,544 B2
(45) Date of Patent: Jan. 21, 2014

(54) TWIN MONOS ARRAY FOR HIGH SPEED APPLICATION

(75) Inventors: Kimihiro Satoh, Portland, OR (US); Tomoko Ogura, Hillsboro, OR (US); Ki-Tae Park, Hwasung (KR); Nori Ogura, Hillsboro, OR (US); Yoshitaka Baba, Beaverton, OR (US)

(73) Assignee: Halo LSI, Inc., Hillsboro, OR (US)

( * ) Notice: Subject to any disclaimer, the term of this patent is extended or adjusted under 35 U.S.C. 154(b) by 830 days.

(21) Appl. No.: 12/079,966

(22) Filed: Mar. 31, 2008

(65) Prior Publication Data

US 2008/0186763 A1 Aug. 7, 2008

Related U.S. Application Data

(62) Division of application No. 11/215,528, filed on Aug. 30, 2005, now Pat. No. 7,352,033.

(51) Int. Cl.
*H01L 29/772* (2006.01)

(52) U.S. Cl.
USPC ........... 257/365; 257/324; 257/411; 257/756; 257/E23.151; 257/E23.164

(58) Field of Classification Search
USPC .................. 257/365, 324, 411, 756, E23.151, 257/E23.164
See application file for complete search history.

(56) References Cited

U.S. PATENT DOCUMENTS

| | | | |
|---|---|---|---|
| 6,011,725 A | 1/2000 | Eitan | |
| 6,038,169 A | 3/2000 | Ogura et al. | |
| 6,248,633 B1 | 6/2001 | Ogura et al. | |
| 6,255,166 B1 | 7/2001 | Ogura et al. | |
| 6,388,293 B1 | 5/2002 | Ogura et al. | |
| 6,399,441 B1 | 6/2002 | Ogura et al. | |
| 6,469,935 B2 | 10/2002 | Hayashi | |
| 6,531,350 B2 | 3/2003 | Satoh et al. | |
| 6,631,088 B2 | 10/2003 | Ogura et al. | |
| 6,707,079 B2 | 3/2004 | Satoh et al. | |
| 6,756,271 B1 | 6/2004 | Satoh et al. | |
| 6,759,290 B2 | 7/2004 | Ogura et al. | |
| 2002/0191453 A1* | 12/2002 | Owa ............................ 365/200 |

* cited by examiner

*Primary Examiner* — Long Pham
(74) *Attorney, Agent, or Firm* — Saile Ackerman LLC; Stephen B. Ackerman; Rosemary L. S. Pike

(57) ABSTRACT

A stitch area configuration for word gates and control gates of a twin MONOS metal bit array comprises control gates on sidewalls of the word gates wherein the word gates and control gates run in parallel. Control gate poly contacts contact each of the control gates aligned in a row at the stitch area perpendicular to the control gates. Two word gate poly contacts at the stitch area contact alternating word gates. Also provided are bit lines, word line and control gate decoders and drivers, a bit line decoder, a bit line control circuit, and a chip controller to control the memory array. The invention also provides twin MONOS metal bit array operations comprising several control gates driven by one control gate driver circuit and one word gate driven by one word gate driver circuit, as well as erase inhibit and block erase.

5 Claims, 43 Drawing Sheets

TWIN MONOS ARRAY FOR HIGH SPEED APPLICATION

This is a divisional application of U.S. patent application Ser. No. 11/215,528, filed on Aug. 30, 2005 now U.S. Pat. No. 7,352,033.

BACKGROUND OF THE INVENTION

1) Field of the Invention

The Invention relates to a non-volatile memory cell with Twin MONOS structure, particularly aiming to high-speed application.

2) Description of the Related Art

Seiki Ogura et al introduced Twin MONOS original cell structure and its device operation in U.S. Pat. Nos. 6,255,166, 6,399,441 and 6,388,293, assigned to a common assignee and herein incorporated by reference in their entirety. A twin MONOS cell consists of a word gate as a select gate, a control gate pair on both sides of the word gate having an ONO memory element underneath, and a bit pair as source/drain diffusion on the other side of the control gates. The authors also provided two different array structures with fabrication methods; diffusion bit array in U.S. Pat. No. 6,248,633 and metal bit array in U.S. Pat. Nos. 6,469,935 and 6,531,350, assigned to a common assignee and herein incorporated by reference in their entirety. The diffusion bit array consists of a bit line, a control gate line having an ONO memory element underneath along the bit line, and a word gate connecting select gates crossing the bit line. It is convenient for high-density applications. The metal bit array consists of a word line running parallel to a control gate line and a bit line crossing the word line and control gate. Other related US patents include U.S. Pat. No. 6,631,088 to Ogura et al, U.S. Pat. Nos. 6,756,271 and 6,707,079 to Satoh et al, U.S. Pat. No. 6,759,290 to Ogura et al, U.S. Pat. No. 6,038,169 to Ogura et al and U.S. Pat. No. 6,011,725 to Eitan et al.

SUMMARY OF THE INVENTION

It is an objective of the present invention to provide a twin MONOS metal bit structure with straight wide channel isolated by straight shallow trench isolation (STI) for high-speed applications wherein two memory elements share a contact.

It is another objective of the present invention to provide a twin MONOS metal bit structure for high-speed applications wherein the control gate is salicided.

It is a further objective of the present invention to provide a word gate and control gate stitch method of twin MONOS metal bit structure for high-speed applications.

It is yet another objective of the present invention to provide a control gate driving method wherein several control gates are sharing one control gate driver.

It is yet another objective of the present invention to provide a word gate and control gate stitch method wherein several control gate lines share one control gate driver.

It is a further objective of the present invention to provide an operating method of twin MONOS metal bit structure for high-speed operation.

The invention provides a metal bit structure of Twin MONOS memory cell with large W, channel width, and its operational method for high-speed applications using a metal bit array. A metal bit structure was proposed in U.S. Pat. Nos. 6,469,935 and 6,531,350, assigned to the same assignee as the present invention and herein incorporated by reference in their entirety, as described above, where four memory elements share a contact. The structure is preferred for high-density applications. Another type of metal bit structure was also proposed in U.S. Pat. No. 6,707,079, also assigned to the same assignee as the present invention and herein incorporated by reference in its entirety, where two memory elements share a contact.

In a conventional metal bit twin MONOS memory array, individual cells are two dimensionally disposed by a plurality of bit lines extending in a first direction and a plurality of word gate lines with a pair of control gates on their sidewalls extending in a second direction crossing the first direction. The adjacent cells in the second direction are separated by an isolation feature, such as STI, for example. Dopant with opposite polarity to the substrate silicon is injected and diffused in the silicon between the control gates. It is designated to apply operation voltage on each diffusion area formed on both sides of a word gate independently to allow two-way operation. It requires two metal lines to apply operation voltage on each side diffusion area independently. Every even contact is connected to one metal line and every odd contact is connected to the other metal line. For an array structure where two memory cells share an isolated diffusion in between, an isolated silicon-isolation pitch is featured as equal to two metal pitches. Contact margin within diffusion is often required to prevent contact off landing. Previous art added extensions to isolated silicon alternately to meet this requirement. Another prior art achieved four memory cells sharing one diffusion area by bridging adjacent diffusions alternately. It allows further miniaturization of the twin MONOS memory array since the silicon isolation pitch can be reduced to one metal line pitch used for a bit line. The silicon extension on a 2-cell shared application or the diffusion bridge on a 4-cell shared application is configured by adequate STI shapes. The isolated silicon winds through the STI's along a bit line. It generates a variation in a width of the isolated silicon along a bit line. The twin MONOS device may lose the symmetry of twin structure on both sides of the word line. That may cause reading errors since the difference in cell current may appear when the source and drain voltage is switched in a read operation. In the present invention, the surface silicon is separated by STI configured in straight lines to minimize variation of the width of the isolated silicon.

Channel widths in the prior arts are designated as a minimum feature size. It is convenient to reduce cell size but not to increase cell read current for high-speed application since the cell current is proportional to the channel width. In 2-cell application, isolation and isolated silicon pitch is equal to two metal line pitches containing two metal widths and two spaces in between. The width of isolation silicon becomes at least 3 times wider than its minimum feature size.

It is important to stitch the word gate and control gate with metal to minimize RC constant, defined as the product of the total resistance and capacitance (RC), to achieve high-speed operation. The method of the word gate and the control gate stitch and the topology of the stitch area for high-speed operation are shown in the present invention.

Although one control gate driver drives one control gate line in the conventional twin MONOS memory, the method of driving several control gate lines with one control gate driver is shown in the present invention (hereinafter, that is called "multi CG drive"). The area of the CG driver becomes smaller in the present invention because the number of drivers is reduced. The present invention provides the word gate and control gate stitch method for "multi CG drive".

According to the objects of the invention, a twin MONOS metal bit array structure is provided comprising a plurality of memory cells two dimensionally disposed in a first direction and in a second direction wherein memory cells adjacent in the second direction are separated by isolation regions. A plurality of metal bit lines extends in the first direction, a plurality of conductive word lines extends in the second direction, a plurality of conductive control lines extends in the second direction, and a plurality of diffusion regions lie between adjacent conductive control lines in the first direction.

Also according to the objects of the invention, a stitch area configuration for word gates and control gates of a twin MONOS metal bit array is provided comprising control gates on sidewalls of the word gates wherein the word gates and control gates run in parallel. Control gate poly contacts contact each of the control gates aligned in a row at the stitch area perpendicular to the control gates. Two word gate poly contacts at the stitch area contact alternating word gates.

Also according to the objects of the invention, another stitch area configuration for word gates and control gates of a twin MONOS metal bit array is provided comprising control gates on sidewalls of word gates wherein the word gates and control gates run in parallel. Control gate poly contacts contact each of the control gates placed in a "zig-zag" shape at the stitch area. One word gate poly contact at the stitch area contacts alternating word gates.

Also in accordance with the objects of the invention, a twin MONOS metal bit array operation is provided. Several control gates are driven by one control gate driver circuit and one word gate is driven by one word gate driver circuit.

Also in accordance with the objects of the invention, an EEPROM semiconductor memory device is provided comprising a memory array comprising word lines, control gates, and bit lines, word line and control gate decoders and drivers, a bit line decoder, a bit line control circuit, and a chip controller to control the memory array.

DETAILED DESCRIPTION OF THE PREFERRED EMBODIMENTS

Figure 1:
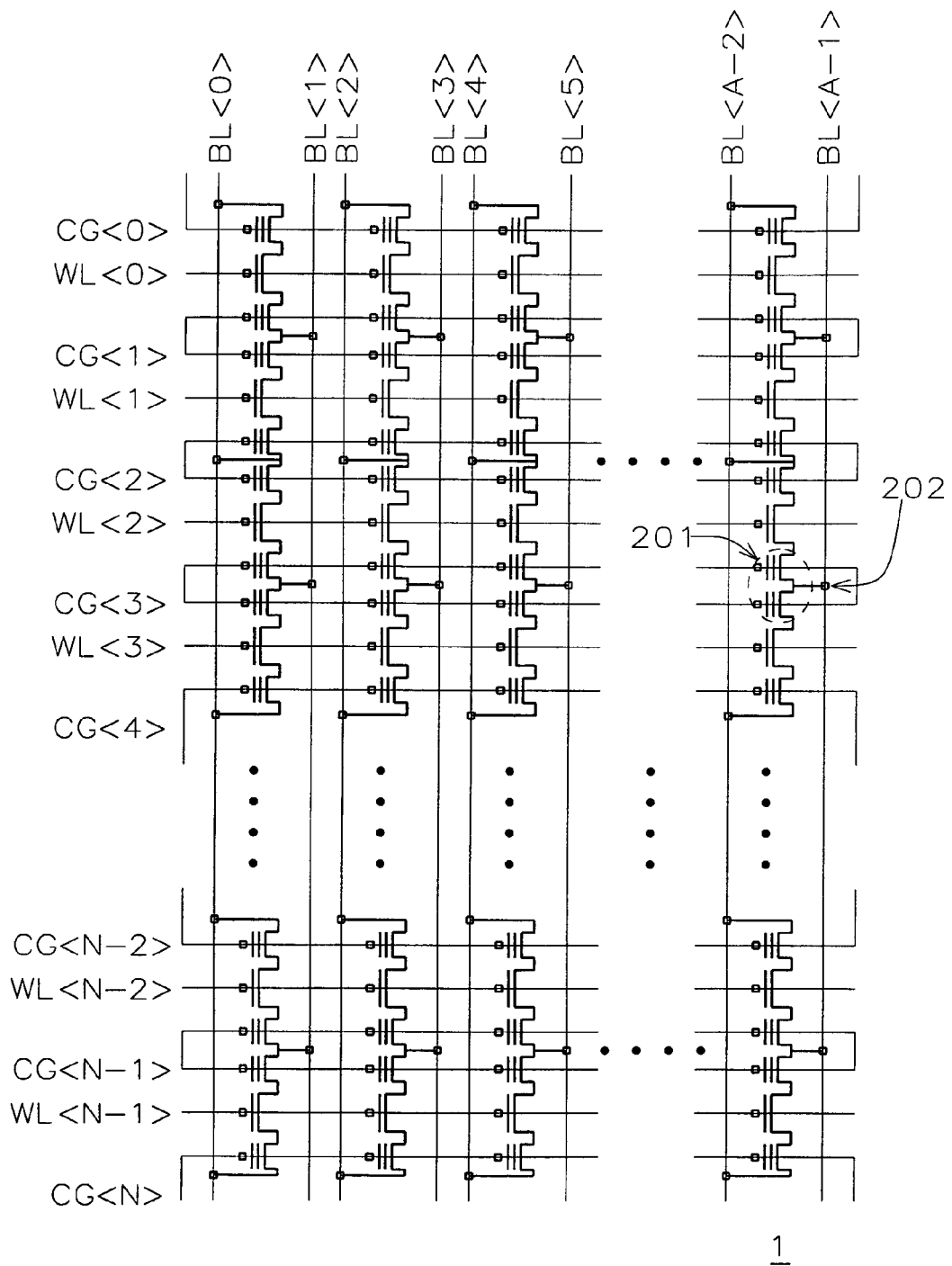
FIG. 1 is an electrical schematic diagram of a twin MONOS metal bit structure of the prior art wherein two memory elements share a bit contact.
Figure 2:
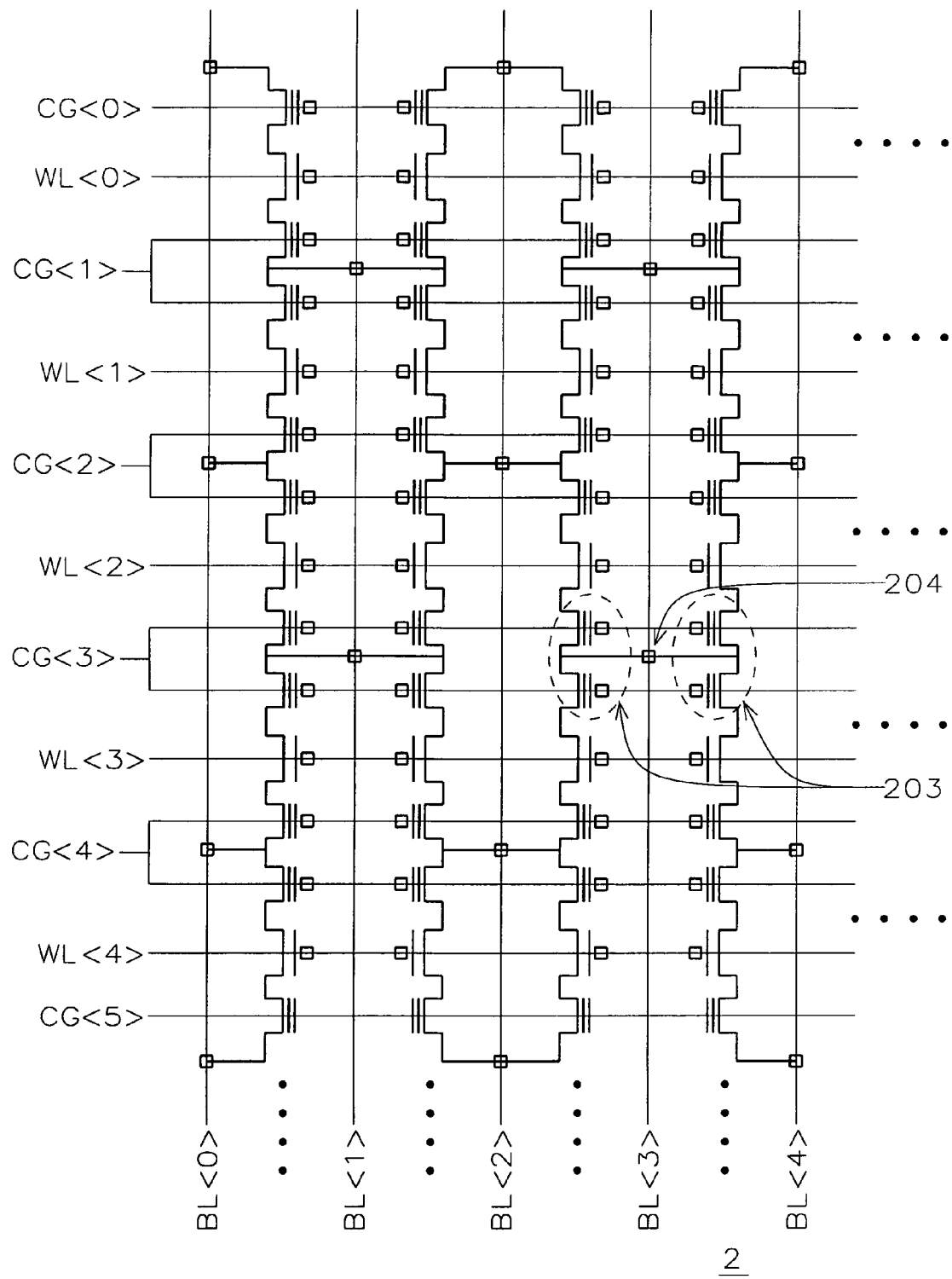
FIG. 2 is an electrical schematic diagram of a twin MONOS metal bit structure of the prior art wherein four memory elements share a bit contact.

The prior arts of twin MONOS arrays, in U.S. Pat. Nos. 6,469,935 and 6,531,350, assigned to a common assignee as the present invention and herein incorporated by reference in their entirety, are shown in FIGS. 1 and 2. FIG. 1 shows an electrical circuit diagram of a twin MONOS metal bit structure 1 wherein two memory elements (1 unit of "hard bit" 201) share a bit contact 202. FIG. 2 shows the schematic diagram of a twin MONOS metal bit structure 2 wherein four memory elements (2 units of "hard bit" 203) share a bit contact 204.

Figure 3:
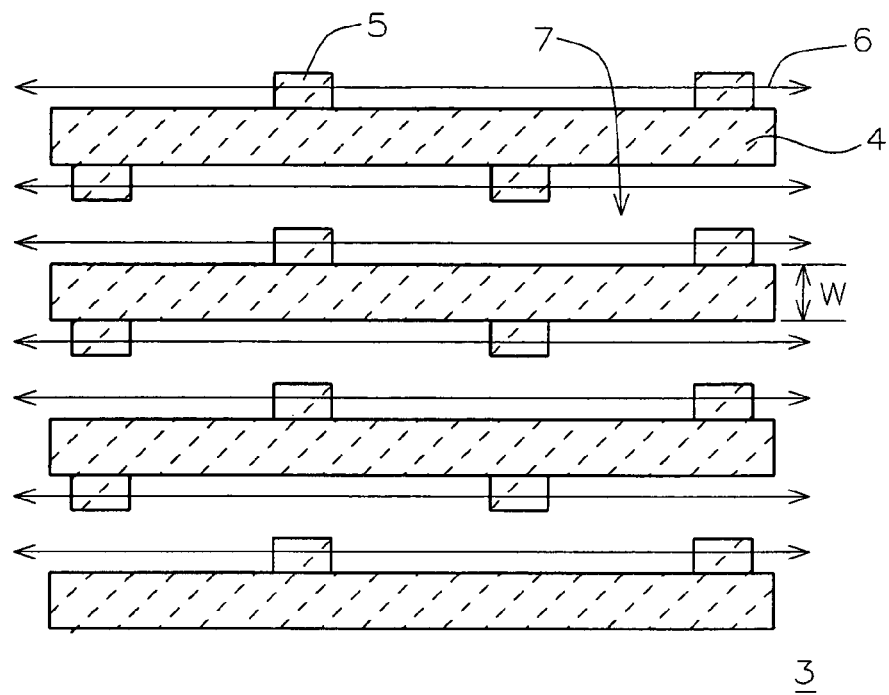
FIGS. 3-4 are top view representations of a twin MONOS metal bit structure of the prior art wherein two memory elements share a bit contact.
Figure 4:
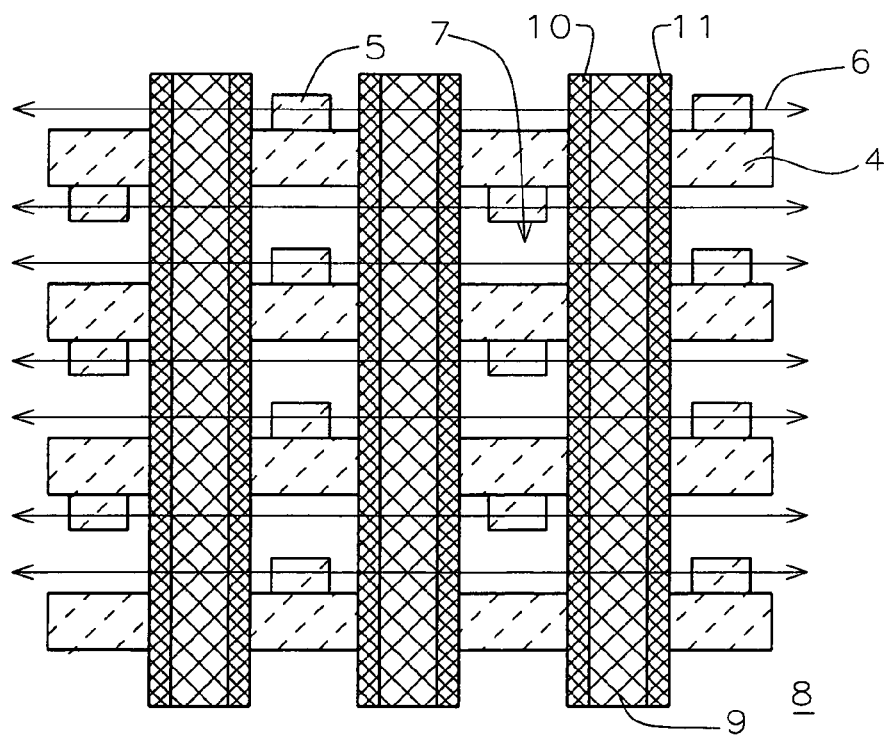
Figure 5:
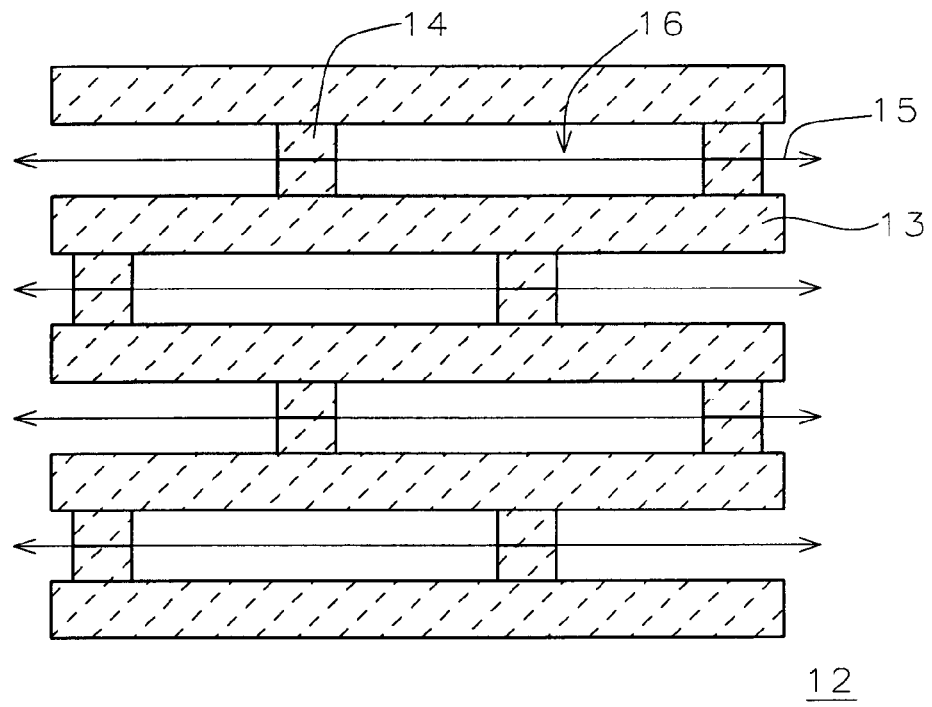
FIGS. 5-6 are top view representations of a twin MONOS metal bit structure of the prior art wherein four memory elements share a bit contact.
Figure 6:
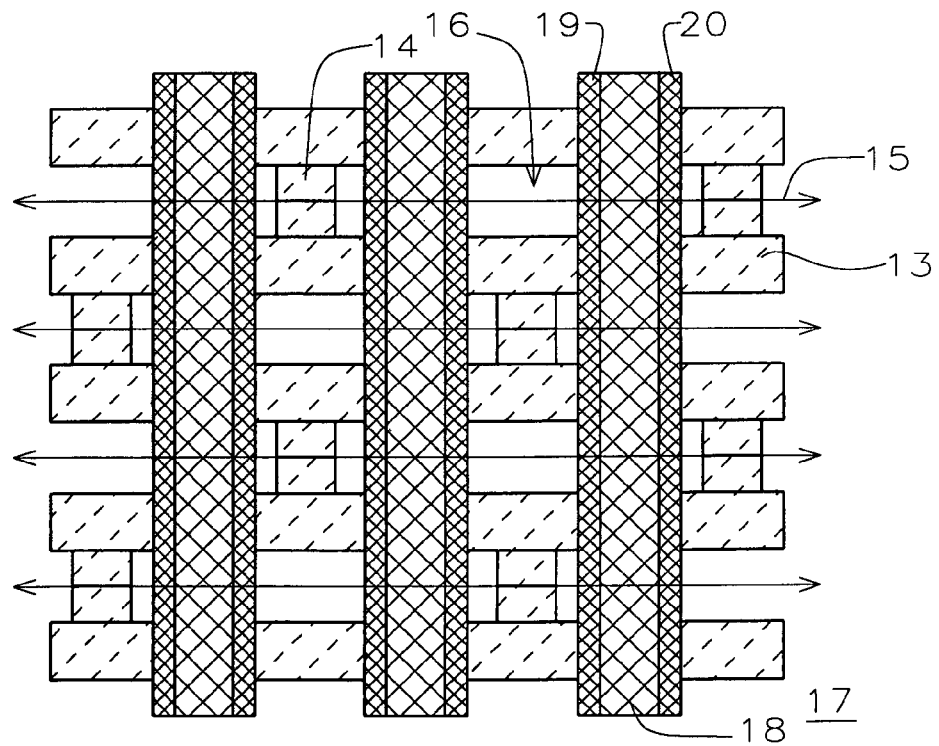

FIG. 3 shows substrate silicon isolation structure of the prior art of a twin MONOS metal bit structure 3 wherein two memory elements (1 unit of "hard bit" 201) share a diffusion area in between as shown in FIG. 4. The extension 5 is added on both sides of isolated silicon 4 alternately to place a bit contact. FIG. 5 shows substrate silicon isolation structure of the prior art of a twin MONOS metal bit structure 12 wherein four memory elements (2 units of "hard bit" 203) share a diffusion area in between as shown in FIG. 6, wherein the bit contact is placed on a bridge 14 between adjacent silicon 13. In the conventional metal bit twin MONOS memory array 8 and 17 shown in FIGS. 4 and 6, respectively, the cells adjacent in a bit line direction are separated by STI 7 and 16, respectively. The substrate silicon 5 and 14 is designated to extend or bridge diffusion areas alternately in both directions along a word line of a word gate 9 and 18 to place bit contacts on. Diffusion extensions 5 are placed on one side of a contact region for one of the dual metal bit lines and on the other side of a contact region for the other dual metal bit line in order to apply an operation voltage individually on a diffusion at each side of the word gate. As a result, two or four memory cells (1 unit or 2 units of "hard bits" 201,203) share the one bit line contact 5 or 14, as shown in FIGS. 3-6. Thus the high-density memory array can be achieved. However, the diffusion isolation 7 and 16 by rectangular STI becomes wiggled as shown in FIGS. 3-6. Because of that, it is difficult to make a twin MONOS device symmetrically under the fluctuation of the process parameters. That becomes the cause of the read error of a memory array because the cell current can be different when the source and drain voltage is switched in the read operation. In the prior art of twin MONOS metal bit array 8 and 17, bit lines 6 and 15 made of a metal layer run perpendicularly to the word gate 9 and 18 and the control gates 10 and 11 and 19 and 20.

Figure 7:
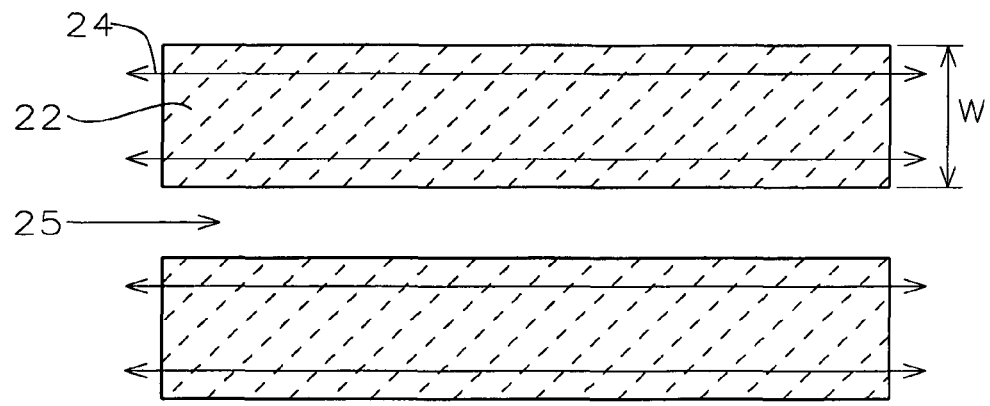
FIGS. 7, 8A, and 8B are top view representations of a twin MONOS metal bit structure of the present invention wherein two memory elements share a bit contact.

FIG. 7 illustrates a top view of an isolation scheme of a substrate silicon surface for the present invention of a twin MONOS memory array 21. The isolation feature (STI) 25 is configured as a straight line to keep the isolated silicon in between extending straight in a direction of a bit line defined as the first direction. The channel width W of a memory cell becomes twice a metal pitch used for a bit line minus the minimum feature size of the isolation; 3 times wider than the prior arts using the minimum feature size as W. The increased channel width allows the high cell current to be acquired. Thus, the high-speed memory operation can be achieved by the present invention.

Figure 8A:
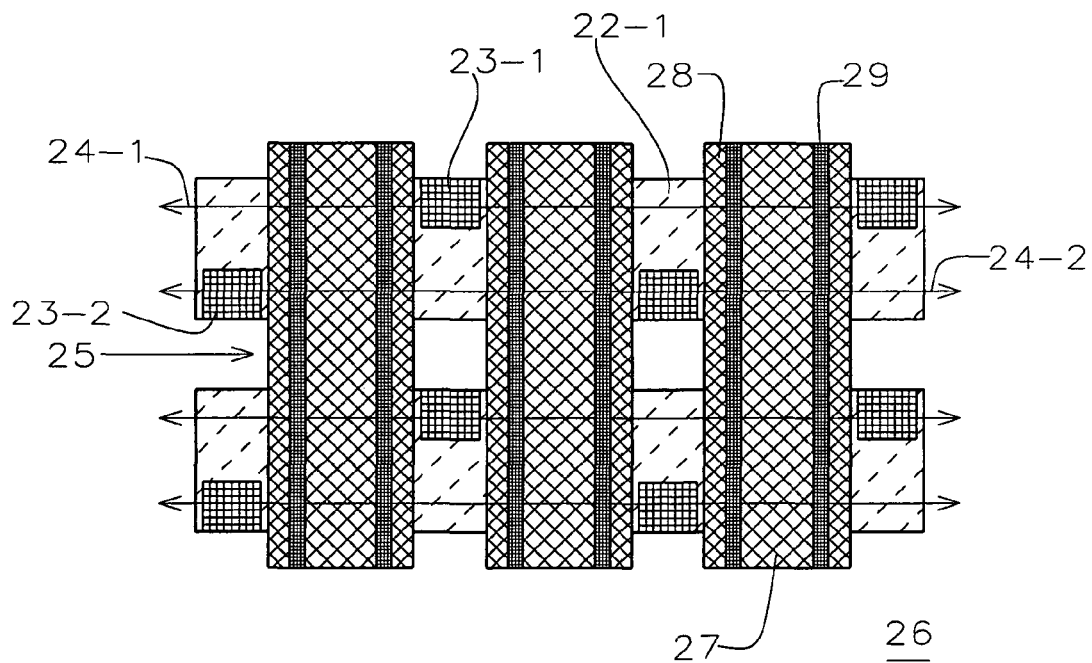

FIG. 8A illustrates the layout of a twin MONOS metal bit array 26 in the present invention. A plurality of isolations 25 configured as straight lines extending in the first direction are placed in the substrate silicon to form isolated silicon 22 in between, wherein a pitch of the isolation is equal to twice a metal pitch used for a bit line. A plurality of word gate lines 27 extend in the second direction crossing the isolated silicon lines, having control gate pair 28 on both sidewalls. The control gate and word gate are separated by oxide-nitride-oxide (ONO) film 29. ONO film also underlies the control gate as a memory element. Diffusion area 22-1, with opposite polarity to the substrate, is defined in the isolated silicon between the control gates. A bit line in the first direction consists of dual metal line 24-1 for even bits and 24-2 for odd bits. Alternate diffusion areas are connected to one of the dual metal lines 24-1 or 24-2 through bit contacts 23-1 or 23-2 placed in a zigzag pattern. The electrical circuit diagram of a twin MONOS metal bit array in the present invention is the same as the prior art 1 in FIG. 1.

Figure 8B:
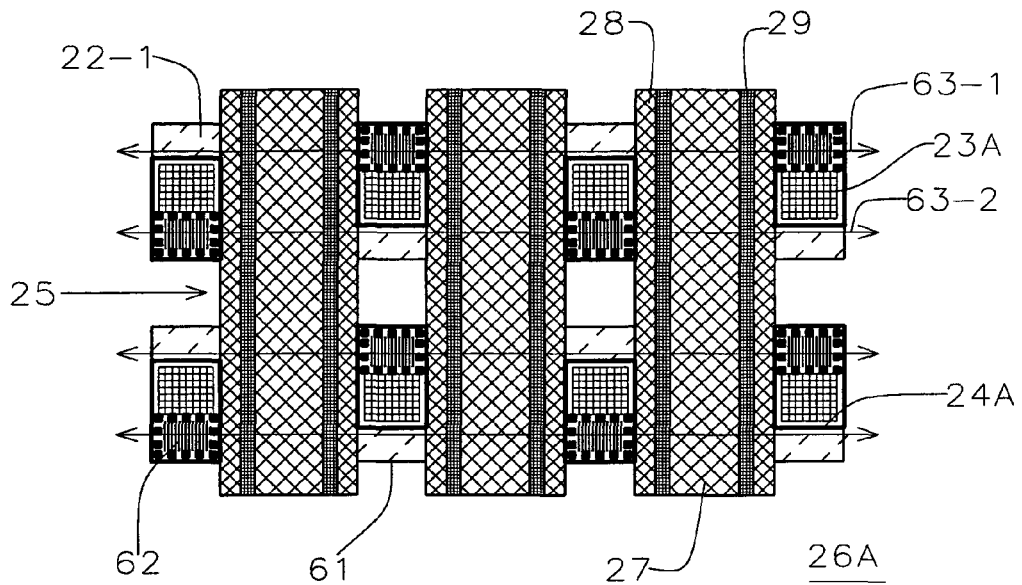

It is important for high-speed operation of the memory array to stitch the word gate (WL) and the control gate (CG) with metal to reduce wiring resistance. FIG. 8B illustrates also the layout of a twin MONOS metal bit array 26A in the present invention. It is different in contact placement and bit line wiring from FIG. 8A. The layout of FIG. 8B is convenient when a layout rule restricts a contact margin within the active area. A bit contact 23A is placed in the middle of the diffusion. It is connected to one of dual bit lines 63-1 or 63-2 assigned to the second metal through first metal pad 24A and a filled via-hole 62. An adjacent bit contact is connected to the other line 63-2 or 63-1.

Figure 9:
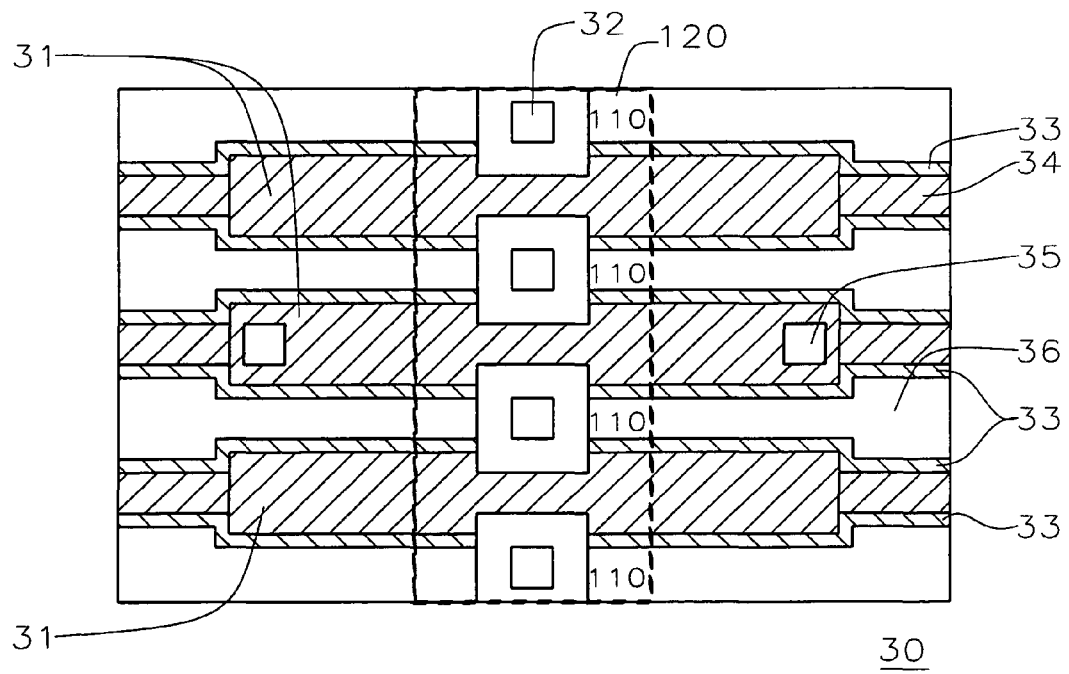
FIGS. 9, 10A, and 10B are top view representations of embodiments of a word gate and control gate (CG) stitch area for the twin MONOS metal bit structure of the invention.

FIG. 9 shows an embodiment of a word gate (WL) and control gate (CG) stitch area for the twin MONOS metal bit structure. The word gate poly line 31 and control gate poly line 33 are running parallel. The word gate poly is widened in the stitch area to place control gate contact pad 32 and word gate contact 35. The control gate poly 33 on a sidewall of the word gate poly 31 is connected to the metal layer through the control gate poly contact 32 placed on the control gate poly extension 110 connecting a pair of control gates in a space between two adjacent word gate poly lines in a row perpendicularly. The extension overlaps the word lines to make sure of continuity between a control gate and its extension. The extension is separated on the word line from an adjacent extension. A salication block 120 covers the extensions 110 in the stitch area and the surrounding word line poly to prevent the control gates' connecting to the word gate with salicide. The control gate contacts 32 are placed in a row in the stitch area to minimize the contact area. The word line poly 31 is connected to the metal layer through the word gate poly contact 35. Alternating word lines 31 have two word gate contacts 35 at the stitch area to bridge over salicide block 120. The metal stitching can be fit in the small area to reduce the total RC constant of the word gate and control gate. It is useful for high-speed operation of the memory.

Figure 10A:
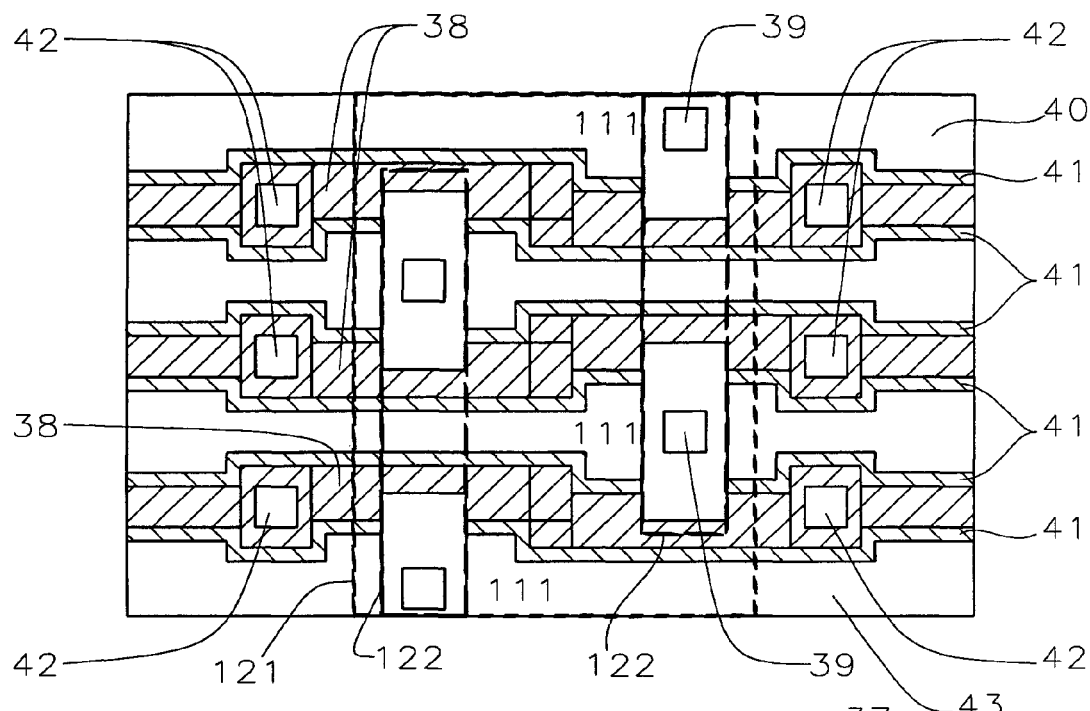

FIG. 10A shows another embodiment of a word gate and control gate (CG) stitch area using zigzag word line poly 38 to stitch word gate 38 and control gate 41 formed on STI 43 for the twin MONOS metal bit structure. It is convenient for a tight rule where control gate contacts cannot be placed in a row. The word gate (WL) poly line 38 and control gate poly line 41 are running parallel. The control gate poly 41 on a sidewall of the word gate poly 38 is connected to the metal layer through the control gate poly contact 39 on control gate poly extension 111 connecting a pair of control gates in a space between two adjacent word lines. The word line zigzags in the stitch area to widen the space in between alternately to place a control gate contact 39. The control gate poly extension 111 overlaps two adjacent word lines. The control gate poly extension 111 and surrounding word gate poly are covered with salicide block 121 to prevent control gates' connecting to word line poly with salicide. The contacts 39 are placed in a zigzag pattern on one side and the other side alternately in the stitch area. The adjacent control gate contacts placed in a row may connect together with upper metal to connect control gate poly alternately to share one driver. This allows "Multi" CG drive. The word line poly 38 is connected to the metal layer through the word gate poly contacts 42. A word line 38 has a pair of polysilicon word gate poly contacts 42 at the stitch area to bridge over the salicide block. Metal stitching can be realized with the small area and the total RC constant of word gate and control gate can be reduced. It is useful for high-speed operation of the memory.

Figure 10B:
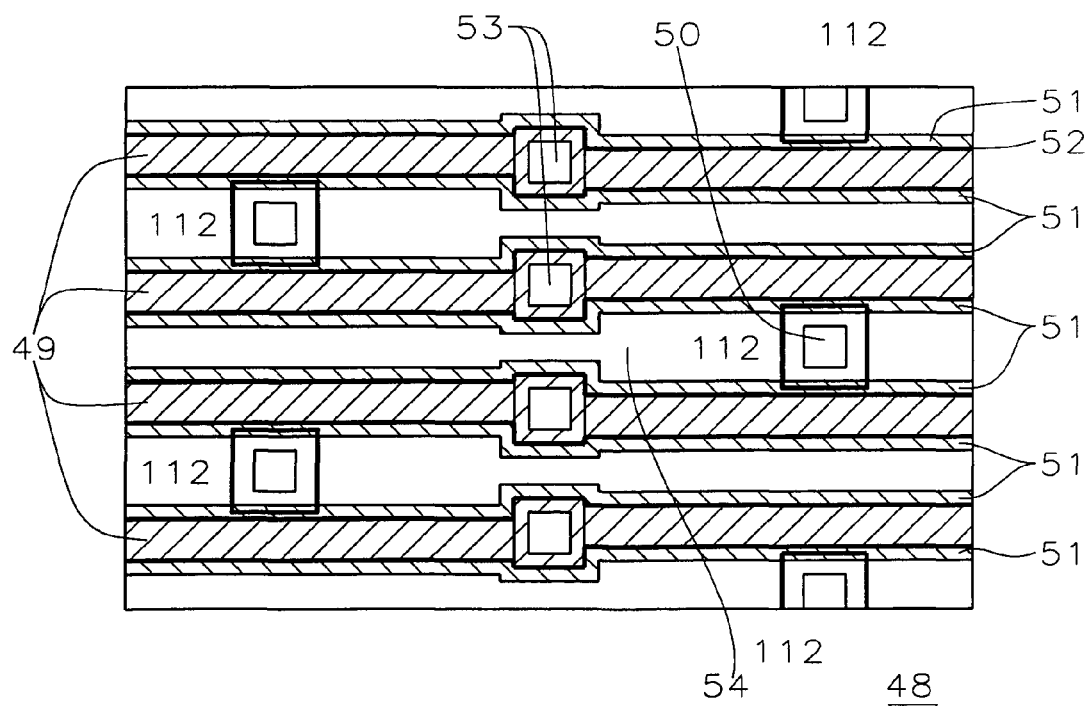

FIG. 10B is modified for no salicide block in the stitch area where there is no area to be detoured. A pair of word contacts is not necessary. A single word contact 53 is placed on every word line 49 in the stitch area to connect to the upper metal.

In the prior art of twin MONOS memory arrays, one control gate is driven by one control gate (CG) driver. In the present invention, the alternate control gates (CG) are connected to a common driver to allow "multi CG drive", wherein several control gates are driven by one control gate driver.

Figure 11:
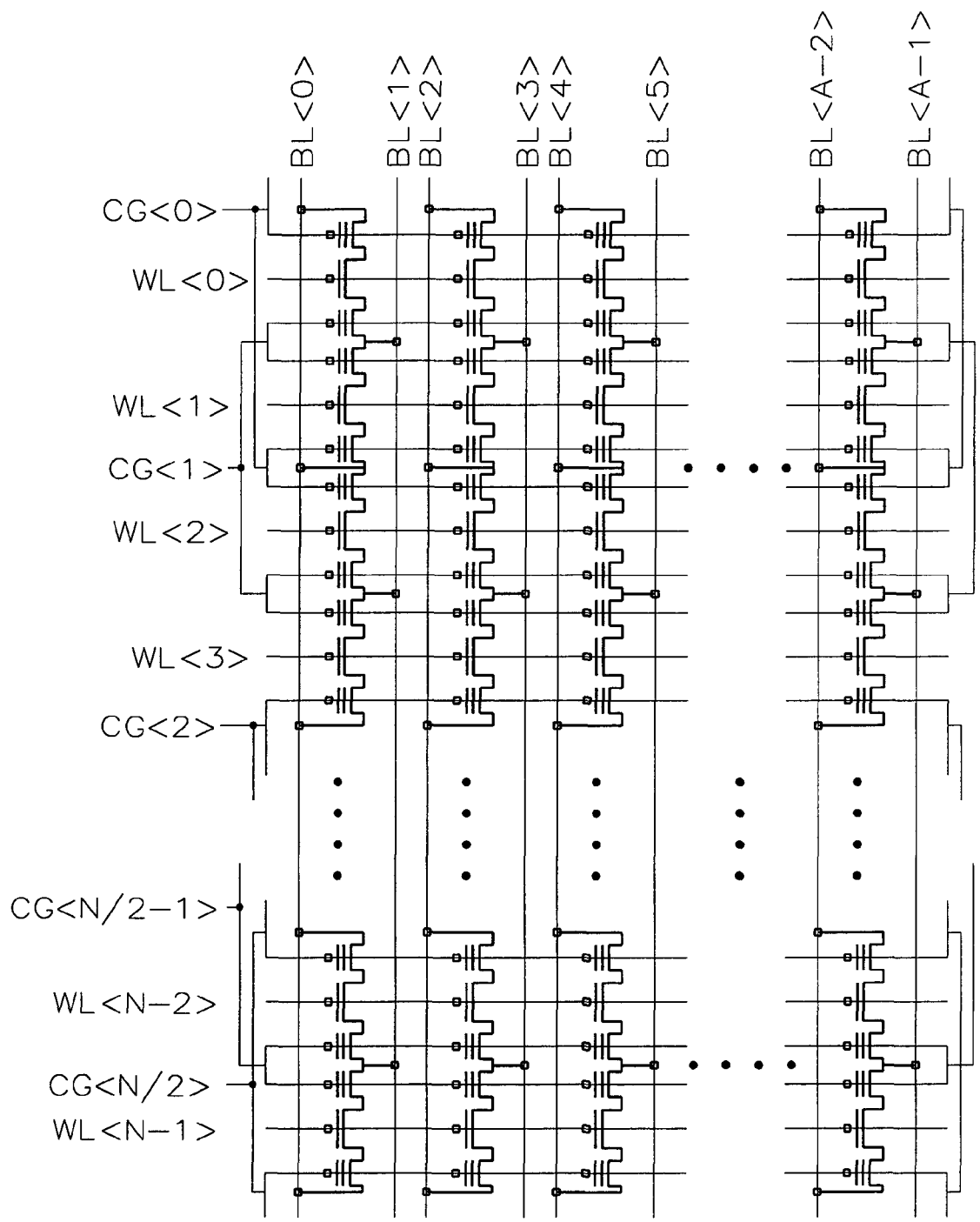
FIGS. 11-12 show electrical schematic diagrams of a metal bit twin MONOS memory array of the invention wherein "multi CG drive" is incorporated in the twin MONOS memory array shown in FIG. 1.
Figure 12:
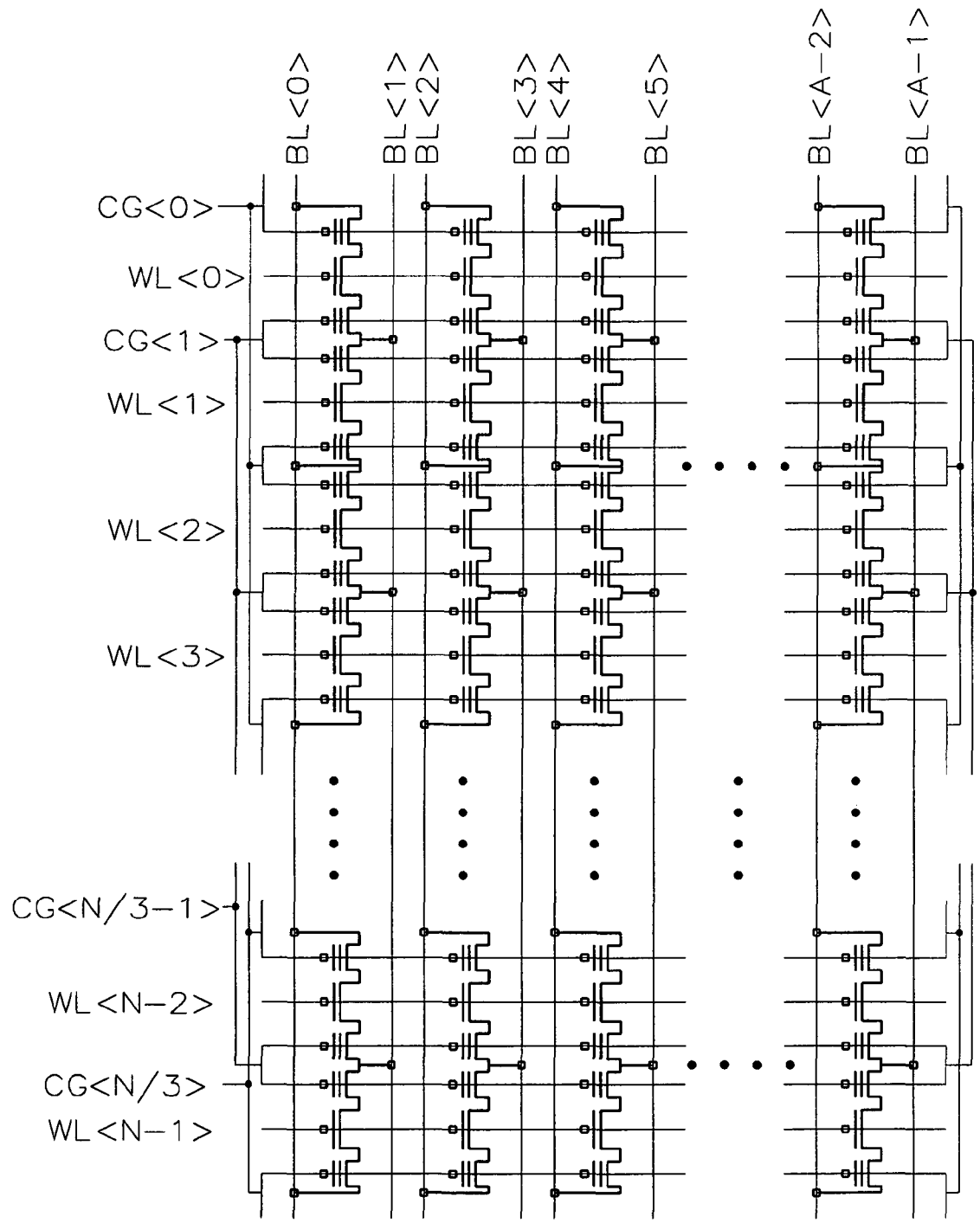

FIGS. 11-12 show the schematic diagram of a metal bit twin MONOS memory array wherein "multi CG drive" is incorporated. One control gate driver circuit drives every other control gate. One control gate driver can drive two control gates (FIG. 11), three control gates (FIG. 12), four control gates, five control gates, etc. Figures are not shown for more than three control gates, but it will be understood that drivers to control more than three control gates can be provided in a similar manner to those shown in FIGS. 11 and 12.

Figure 13:
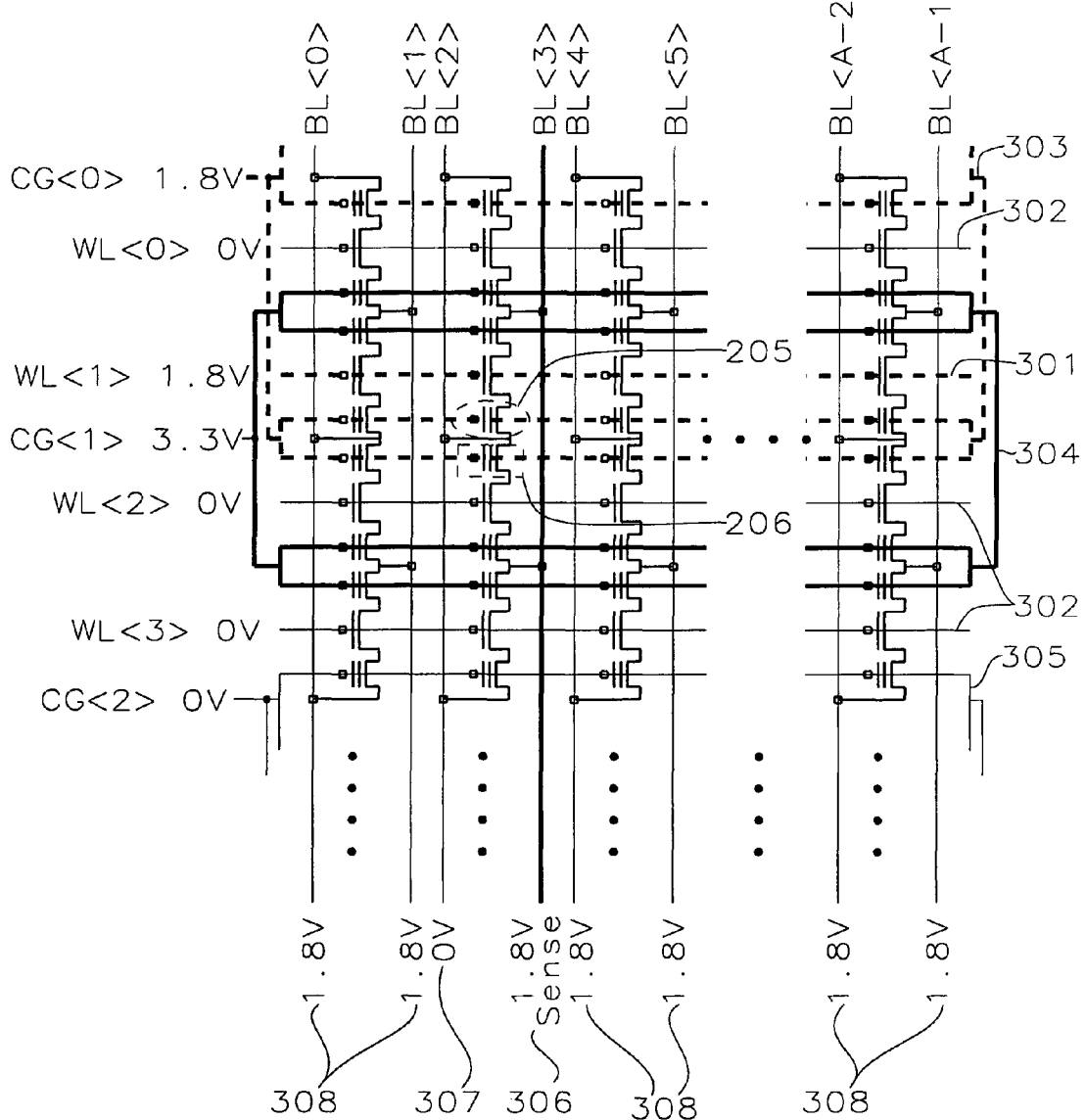
FIG. 13 shows an electrical schematic diagram of the read operation voltage condition in the case where "multi CG drive" of the present invention is applied to a twin MONOS memory array shown in FIG. 1.

FIG. 13 shows the read operation voltage condition in the case where "multi CG drive" is applied to a twin MONOS memory array 1 shown in FIG. 1. The selected cell 205 is supposed to be read. The cell 206 under the selected control gate 303 is not selected. The selected word gate (WL) 301 is set at 1.8V, power supply voltage. The unselected WL's 302 are set at 0V. The selected CG at the read side 303 is set at 1.8V as read voltage and the selected CG at the override side 304 is set at 3.3V. The unselected CG 305 is set at 0V or can be set at 1.8V for high-speed read operation. The selected bit line (BL) 306 is precharged at 1.8V before the selected WL 301 is turned on. Another selected bit line (BL) 307 is set at 0V. The selected bit line (BL) 306 is connected to drain side of selected memory cell. Bit line (BL) 307 is connected to the source side of selected memory cell. The unselected BL 308 is set at 1.8V. The voltage level of selected BL 306 is detected by a sense amplifier after the selected WL 301 is turned on, and thus the read operation can be accomplished without the contradiction even in "multi CG drive". The value of voltages described above may be modified to have another value in the practical application.

Figure 14:
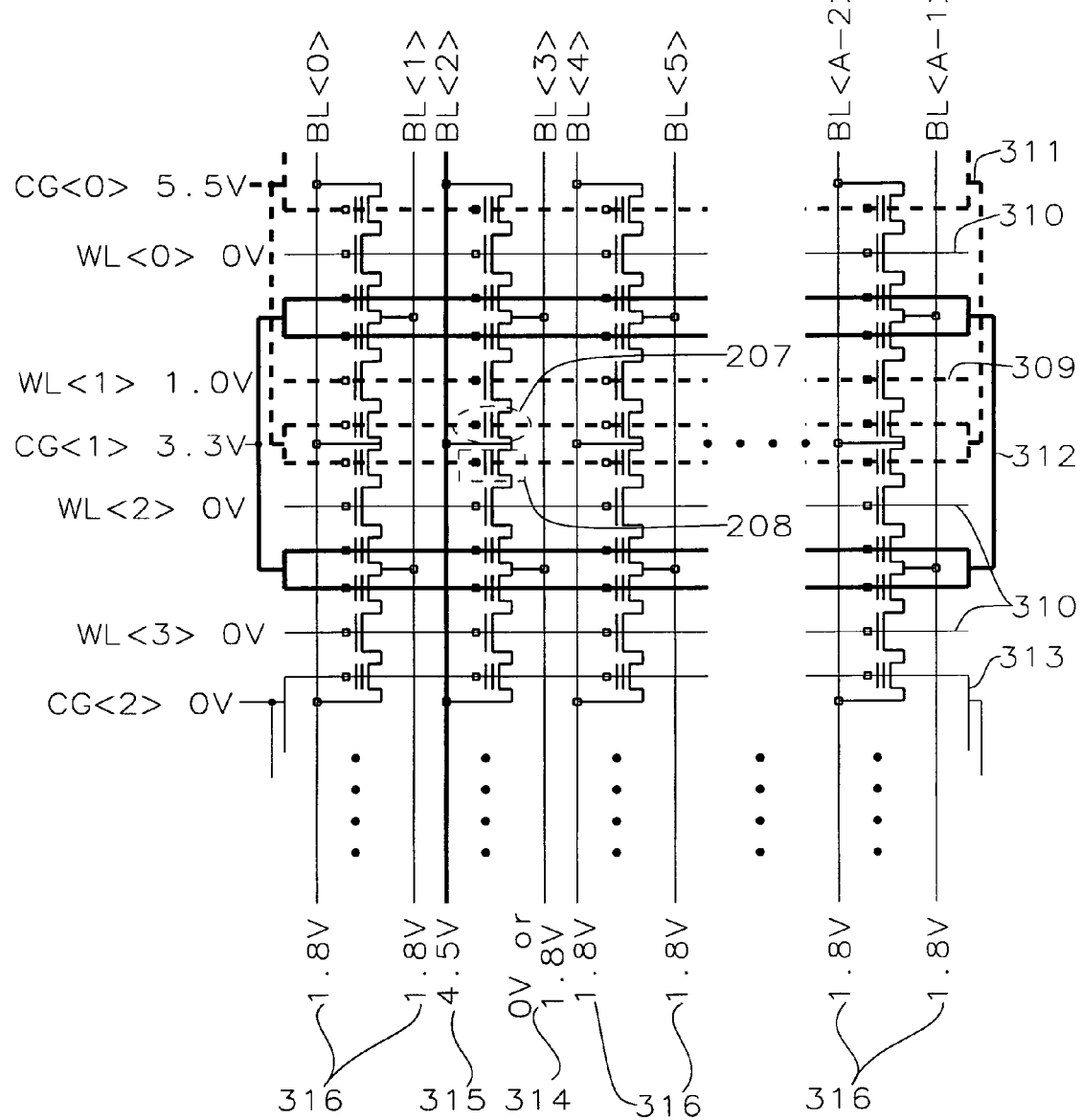
FIG. 14 shows an electrical schematic diagram of the program operation voltage condition in the case where "multi CG drive" of the present invention is applied to a twin MONOS memory array shown in FIG. 1.

FIG. 14 shows the program operation voltage condition in "multi CG drive". The selected cell 207 is supposed to be programmed. The cell 208 under the selected control gate is not selected. The selected WL 309 is set at 1.0V. The unselected WL's 310 are set at 0V. The selected CG at the program side 311 is set at 5.5V as program voltage and the selected CG at the override side 312 is set at 3.3V. The unselected CG 313 is set at 0V or can be set at 1.8V for high speed program operation. The selected BL 315 is set at 4.5V. The selected BL 314 is set at 0V or 1.8V depending on the program data. The data "0" is programmed with the selected BL 314 voltage of 0V. The data "1" is programmed with the selected BL 314 voltage of 1.8V. With the selected BL 314 voltage of 1.8V, the memory cell will not be programmed to "0" (that is, programmed as "1") because the word gate voltage minus the source voltage is less than Vth of the word gate and the program cell current doesn't flow. The unselected BL 316 is set at 1.8V. The cell 208 is not programmed because WL<2> cuts off the program current. Thus the program operation can be accomplished without the contradiction even in "multi CG drive". The value of voltages described above may be modified to have another value in the practical application.

Figure 15:
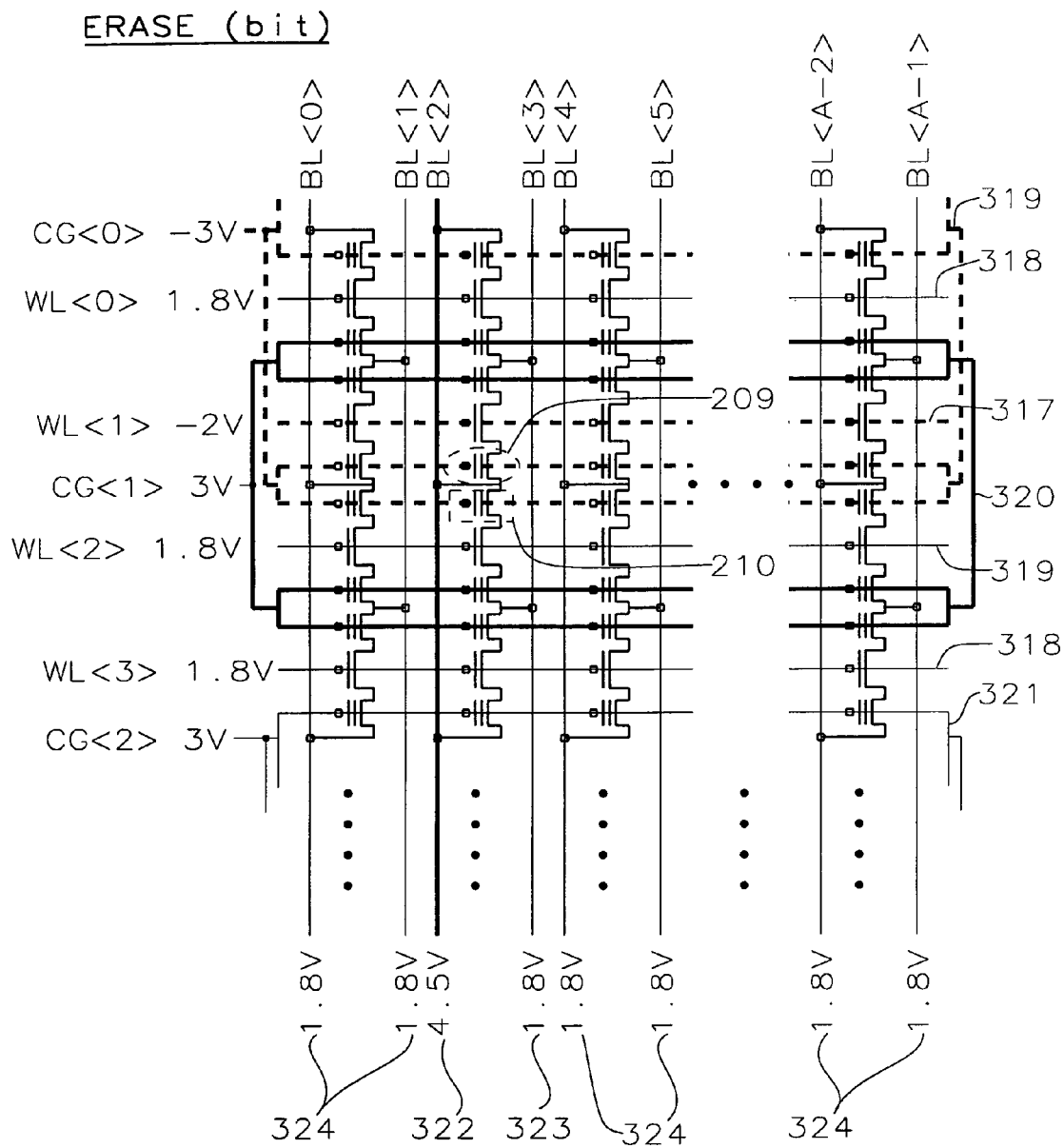
FIG. 15 shows an electrical schematic diagram of the bit erase operation voltage condition in the case where "multi CG drive" of the present invention is applied to a twin MONOS memory array shown in FIG. 1.

FIG. 15 shows the erase (1 bit erase) operation voltage condition in "multi CG drive". The selected cell 209 is supposed to be erased. The cell 210 under the selected control gate 319 is not erased. The selected WL 317 is set at −2V. The selected WL 318 voltage for erase inhibit is set at 1.8V. The unselected WL's 318 are set at 1.8V. The selected CG 319 at the erase side is set at −3V as erase voltage and the selected CG 320 at the override side is set at 3.0V. The unselected CG 321 is set at 3V. The selected BL 322 is set at 4.5V. The unselected BL's 323 and 324 are set to 1.8V. The cell 210 under the selected control gate 319 is not erased because band-to-band hot hole generation is inhibited by the positive voltage of the WL 319. Thus only the selected one bit 209 can be erased. The erase operation can be accomplished without the contradiction even in "multi CG drive". The value of voltages described above may be modified to have another value in the practical application.

Figure 16:
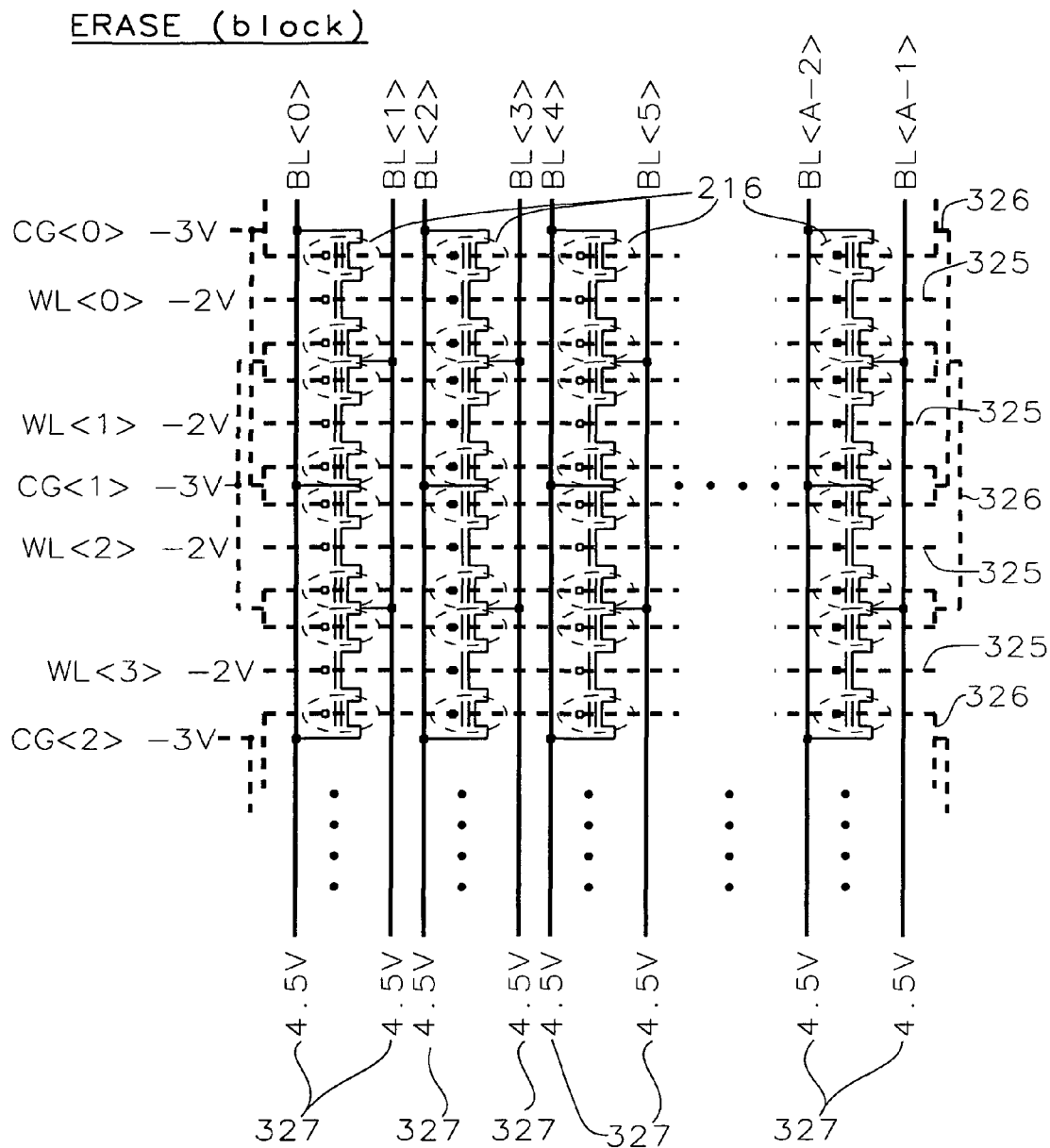
FIG. 16 shows an electrical schematic diagram of the block erase operation voltage condition in the case where "multi CG drive" of the present invention is applied to a twin MONOS memory array shown in FIG. 1.

FIG. 16 shows the erase (block) operation voltage condition in "multi CG drive". All the cells inside the selected block are erased. All the WL's 325 are set at −2V in the selected block. All the CG's 326 are set at −3V in the selected block. All the BL's 327 are set to 4.5V in the selected block. In the unselected block, all WL's, all CG's and all BL's 327 are set at 0V. Thus the erase operation (block) can be accomplished without the contradiction even in "multi CG drive". The value of voltages described above may be modified to have another value in the practical application.

Figure 17:
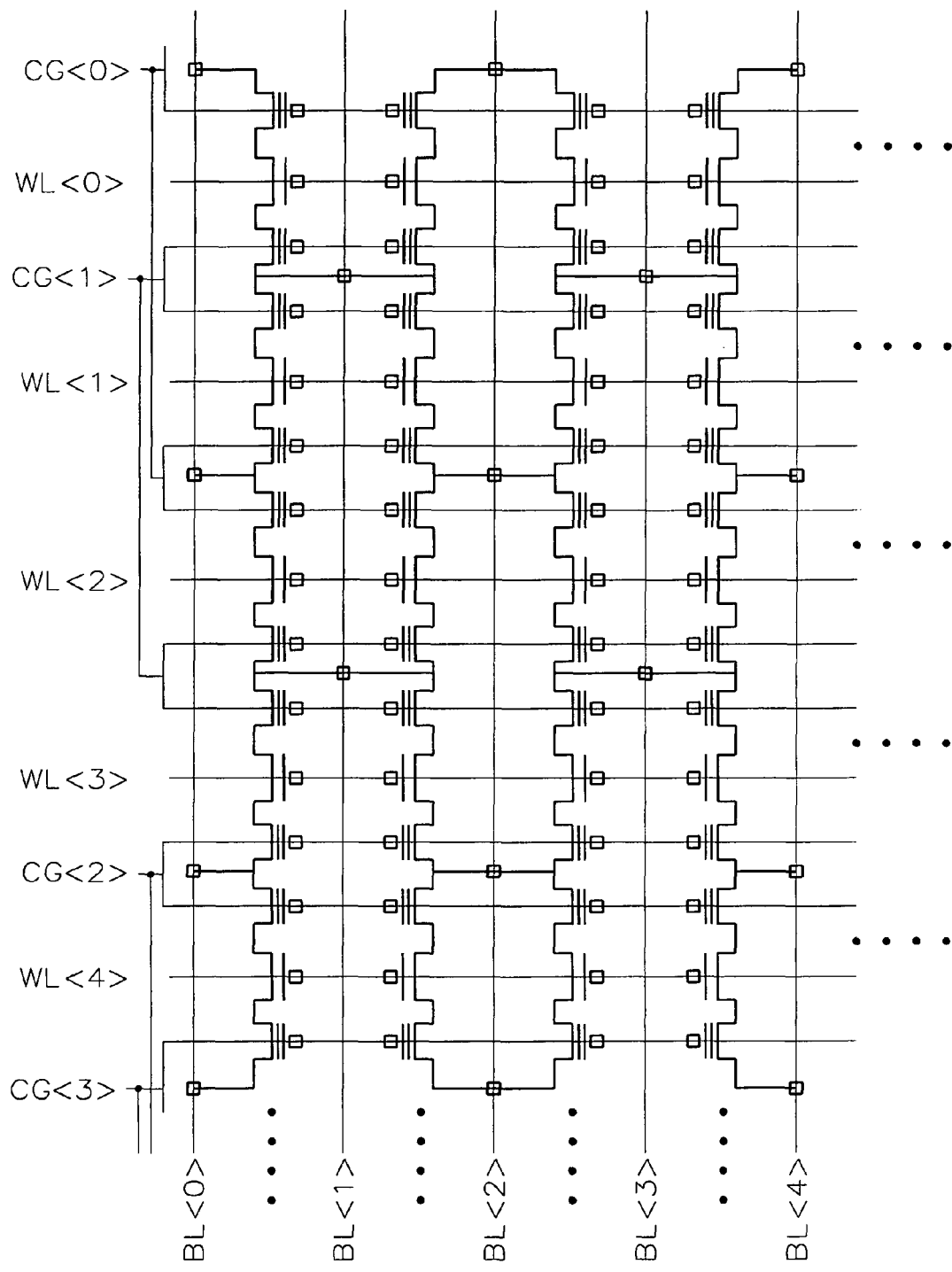
FIGS. 17-18 show electrical schematic diagrams of a metal bit twin MONOS memory array of the invention wherein "multi CG drive" is incorporated in the twin MONOS memory array shown in FIG. 2.
Figure 18:
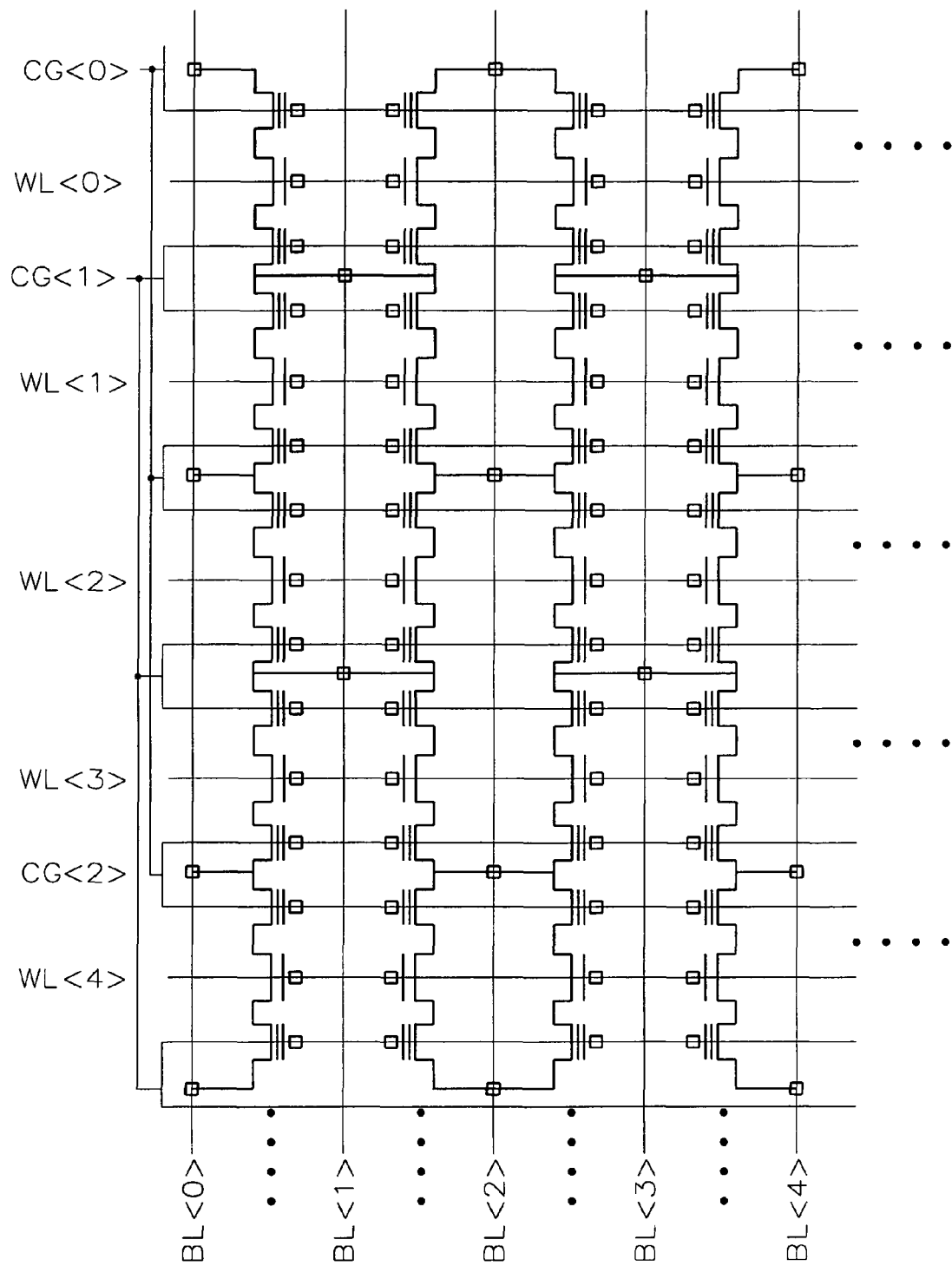

Also, in the prior art of a twin MONOS metal bit array 2 shown in FIG. 2, "multi CG drive" method is available. FIGS. 17-18 show the schematic diagram of a metal bit twin MONOS memory array 46 and 47 wherein "multi CG drive" method is incorporated. One control gate driver circuit drives every other control gate. One control gate driver can drive two control gates (FIG. 17), three control gates (FIG. 18), four control gates, five control gates, etc. (Figures not shown). It will be understood that drivers to control more than three control gates can be provided in a similar manner to those shown in FIGS. 17 and 18.

Figure 19:
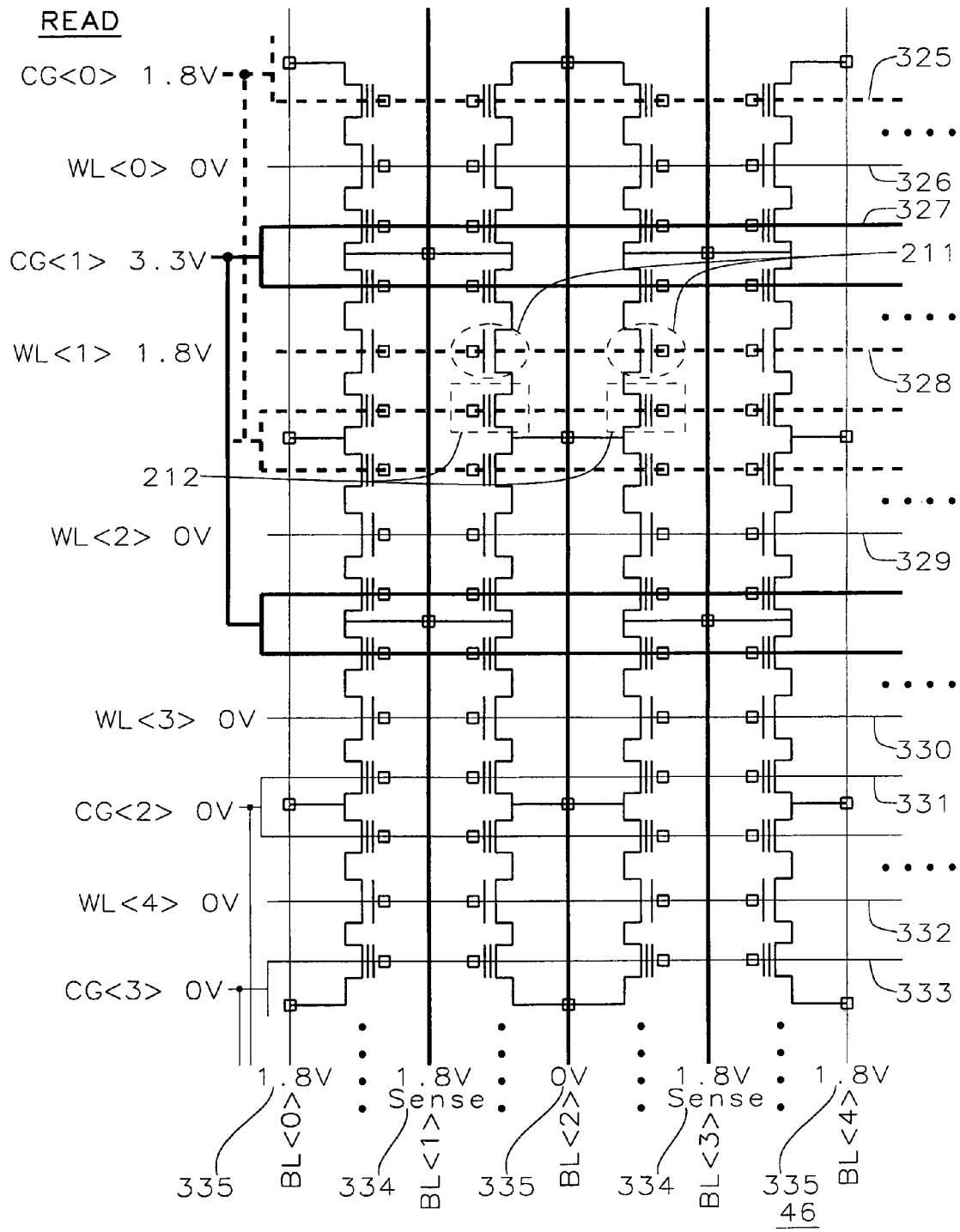
FIG. 19 shows an electrical schematic diagram of the read operation voltage condition in the case where "multi CG drive" of the present invention is applied to a twin MONOS memory array shown in FIG. 2.

FIG. 19 shows the read operation voltage condition in "multi CG drive" for the prior art 2 shown in FIG. 2. The selected cell 211 is supposed to be read. The cell 212 under the selected control gate 325 is not selected. The selected WL 328 is set at 1.8V, power supply voltage. The unselected WL's 326, 329, 330, and 332 are set at 0V. The selected CG at the read side 325 is set at 1.8V as read voltage and the selected CG at the override side 327 is set at 3.3V. The unselected CG's 331 and 333 are set at 0V or can be set at 1.8V for high-speed read operation. The selected BL 334 is precharged at 1.8V before the selected WL 328 is turned on. The unselected BL 335 is 1.8V. The voltage level of selected BL 334 is detected by a sense amplifier to check the cell data after the selected WL 328 is turned on, and thus the read operation can be accomplished without the contradiction even in "multi CG drive". The unselected cells 212 under the selected control gate are not read because WL<2> cuts off the cell current. The value of voltages described above may be modified to have another value in the practical application.

Figure 20:
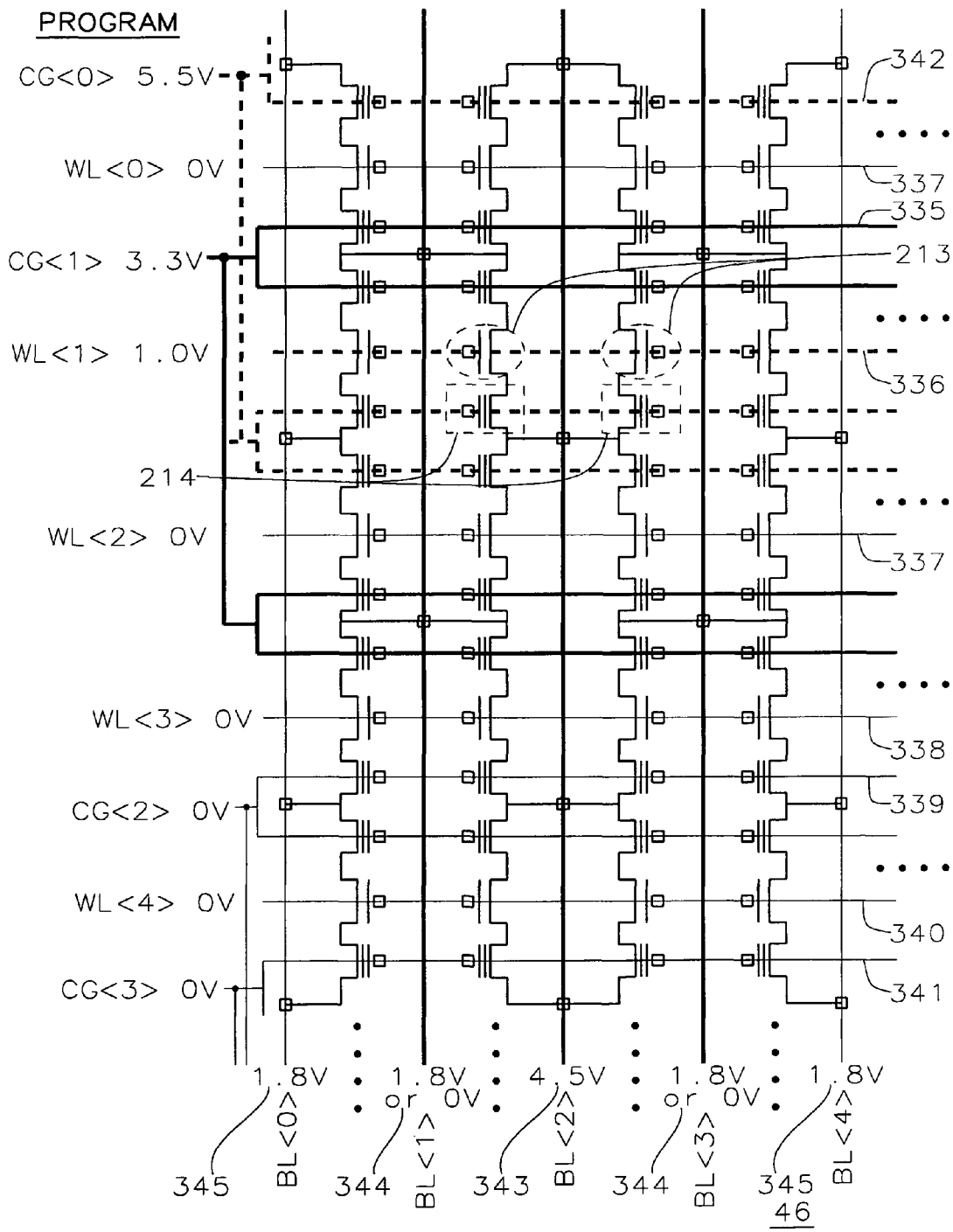
FIG. 20 shows an electrical schematic diagram of the program operation voltage condition in the case where "multi CG drive" of the present invention is applied to a twin MONOS memory array shown in FIG. 2.

FIG. 20 shows the program operation voltage condition in "multi CG drive" for the prior art 2 shown in FIG. 2. The selected cells 213 are supposed to be programmed to "0" or "1" simultaneously. The selected WL 336 is set at 1.0V. The unselected WL's 337, 338, and 340 are set at 0V. The selected CG at the program side 342 is set at 5.5V as program voltage and the selected CG at the override side 335 is set at 3.3V. The unselected CG's 339 and 341 are set at 0V or can be set at 1.8V for high-speed program operation. The selected BL 343 is set at 4.5V. The other side BL 344 of the selected BL 343 is set at 0V or 1.8V depending on the program state. The data "0" is programmed with the selected BL 344 voltage of 0V. The data "1" is programmed with the selected BL 344 voltage of 1.8V. With the selected BL 344 voltage of 1.8V, the memory cell will not be programmed to "0" (that is, programmed as "1") because the word gate voltage minus the source voltage is less than Vth of the word gate and the program cell current doesn't flow. The unselected BL 345 is set at 1.8V. The cells 214 under the selected control gate 342 are not programmed because WL<2> cuts off the program current. Thus the program operation can be accomplished without the contradiction even in "multi CG drive". The value of voltages described above may be modified to have another value in the practical application.

Figure 21:
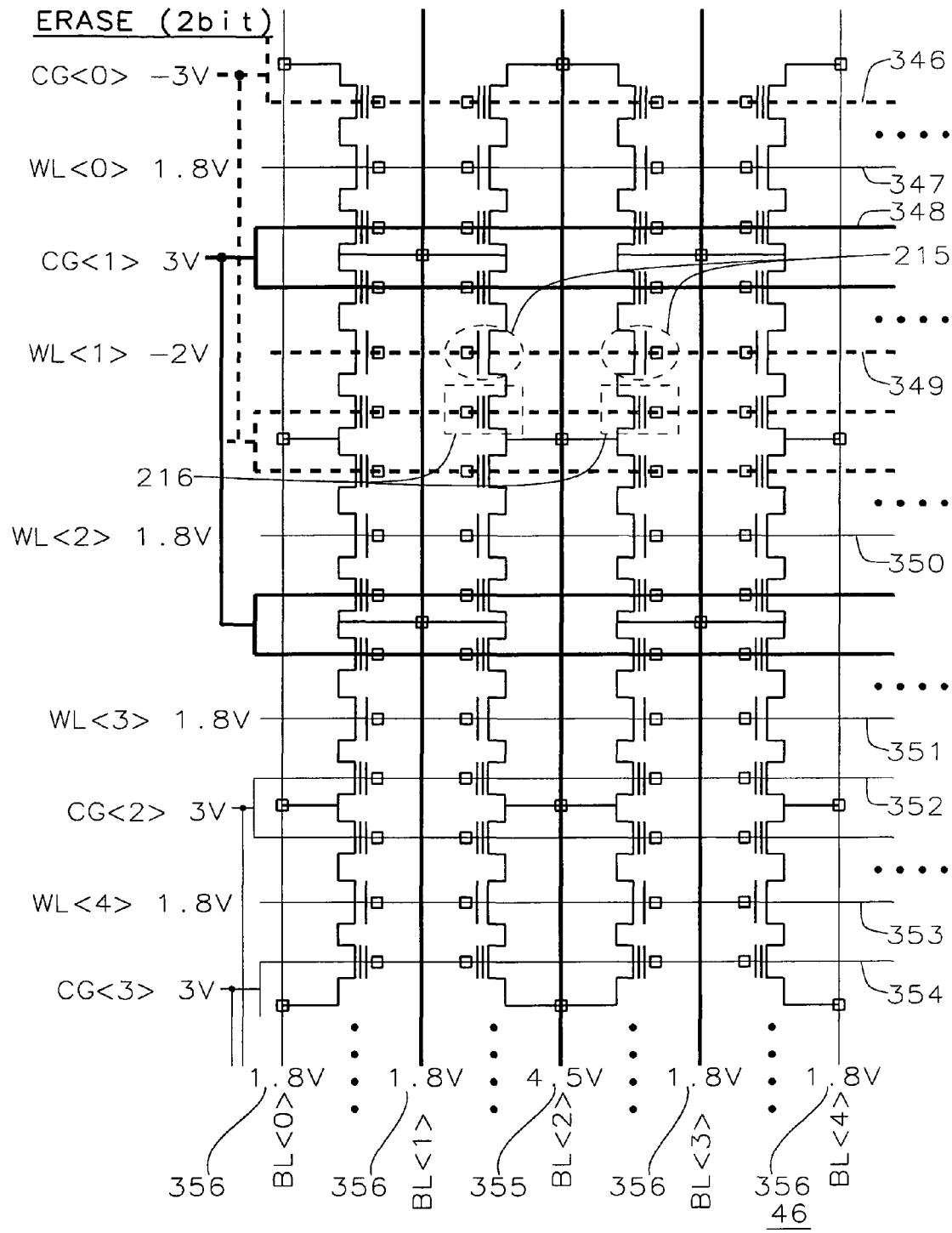
FIG. 21 shows an electrical schematic diagram of the 2-bit erase operation voltage condition in the case where "multi CG drive" of the present invention is applied to a twin MONOS memory array shown in FIG. 2.

FIG. 21 shows the erase (2 bit erase) operation voltage condition in "multi CG drive" for the prior art 2 shown in FIG. 2. The cells 215 are supposed to be erased. The selected WL 349 is set at -2V. The selected WL 350 voltage for erase inhibit is set at 1.8V. The unselected WL's 349, 351, and 353 are set at 1.8V. The selected CG at the erase side 346 is set at -3V as erase voltage and the selected CG at the override side 348 is set at 3V. The unselected CG's 352 and 354 are set at 3V or can be set at 1.8V. The selected BL 355 is set at 4.5V. The unselected BL 356 is set at 1.8V. Thus only the selected two bits ("hard bit" 215) can be erased. The cells 216 under the selected control gate are not erased because band-to-band hot hole generation is inhibited by the positive voltage (1.8V) of the WL 350. Thus the erase operation can be accomplished without the contradiction even in "multi CG drive". The value of voltages described above may be modified to have another value in the practical application.

Figure 22:
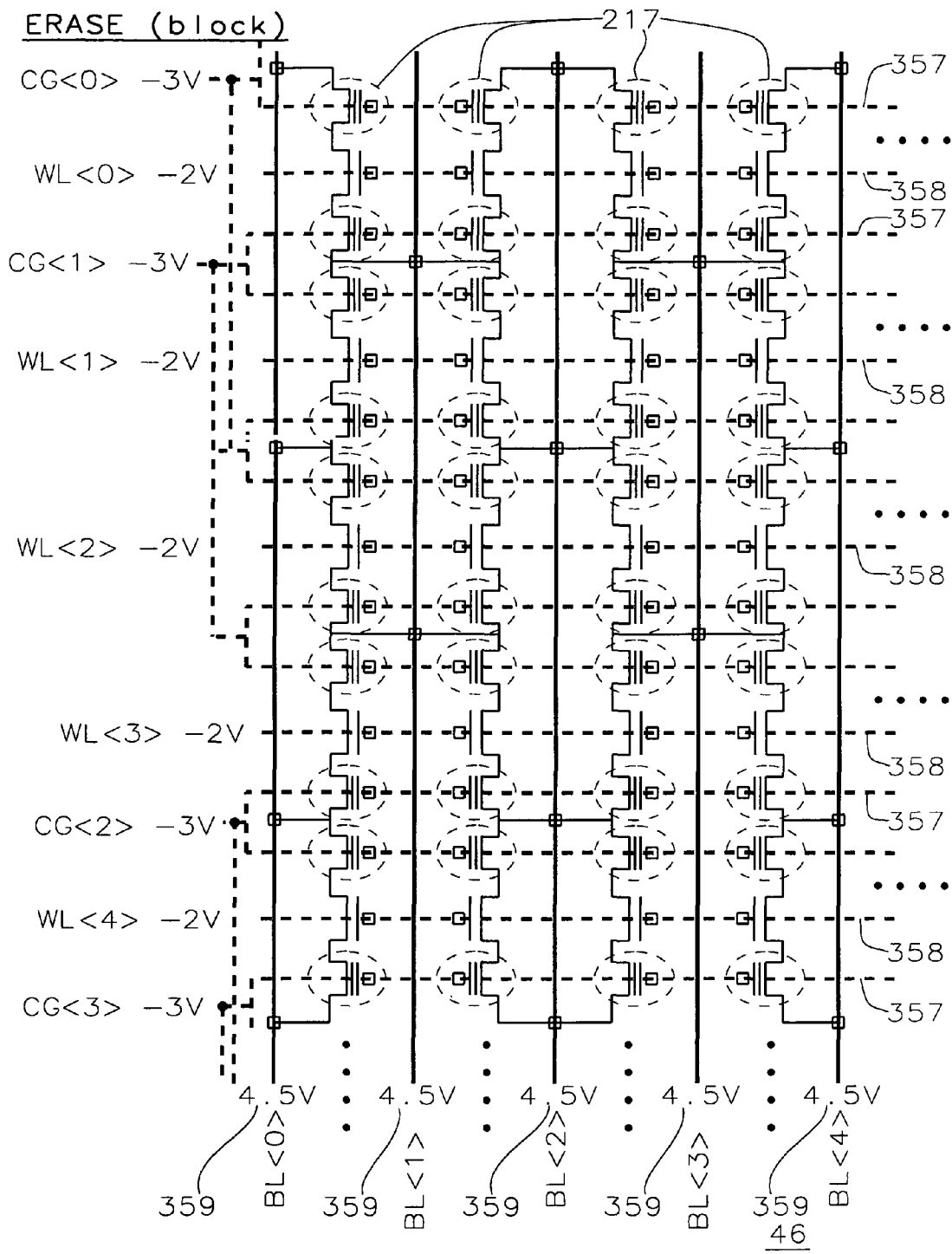
FIG. 22 shows an electrical schematic diagram of the block erase operation voltage condition in the case where "multi CG drive" of the present invention is applied to a twin MONOS memory array shown in FIG. 2.

FIG. 22 shows the erase (block) operation voltage condition in "multi CG drive". All the cells within the selected block are supposed to be erased. The WL 358 is set at -2V in the selected block. The CG 357 is set at -3V in the selected block. The BL 359 is set at 4.5V in the selected block. In the unselected block, all WL's, all CG's and all BL's are set at 0V. Thus the erase operation (block) can be accomplished without the contradiction even in "multi CG drive". The value of voltages described above may be modified to have another value in the practical application.

Because one control driver circuit is shared by several control gate lines, the number of control gate driver circuits can be reduced and layout area can be small. The RC load one control gate driver circuit should drive becomes bigger as the number of control gate lines driven by one control gate driver circuit increases. That means the size of each control gate driver circuit becomes big in driving several numbers of control gate lines at the same time. To achieve both high-speed performance and small area, the optimization of the control gate driver circuit size and the number of control gate lines driven by one control gate driver circuit is necessary.

Figure 23:
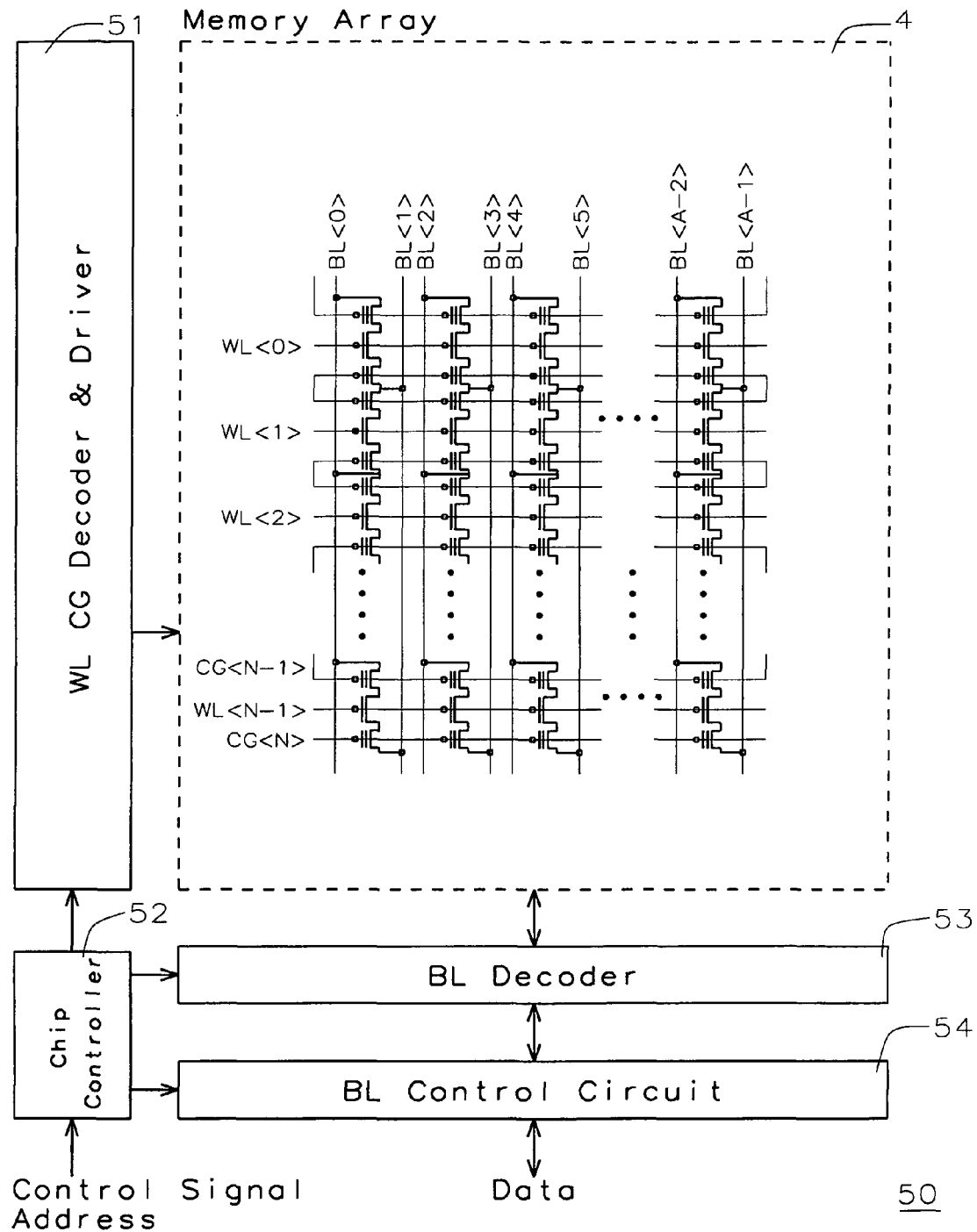
FIG. 23 shows an electrical schematic diagram of an EEPROM semiconductor memory device using the metal bit twin MONOS memory array of the invention.

FIG. 23 shows an EEPROM semiconductor memory device 50 using the metal bit twin MONOS memory array 4. The metal bit twin MONOS 4 comprises a plurality of word lines (WL), a plurality of bit lines (BL), a plurality of control gate lines (CG), and a plurality of twin MONOS cells. Additionally, the memory device can be also formed using another type of twin MONOS, twin MONOS with "CG shared driving" as shown in FIGS. 11-12 and FIGS. 17-18, NAND-type, AND-type, NOR-type flash memory, mask ROMs and EEPROMs though the logic of the addressing is different for each type. The EEPROM semiconductor memory device further is comprised of WL, CG decoder and driver 51, chip controller 52, BL decoder 53, and BL control circuit 54. The WL, CG decoder and driver 51 selects one WL and two CG lines that are located beside the selected WL. The WL, CG decoder and driver 51 applies an specified voltage to the selected WL and CG's in read, program, program verify, erase, and erase verify operations. In this WL, CG decoder and driver 51, WL drivers and CG drivers can share the decoder logic circuits. As a result, total area of decoder and drivers can be reduced. The chip controller 52 controls WL, CG decoder & driver 51, BL decoder 53 and BL control circuit 54. The chip controller 52 receives control and address signals from an external device and generates all signals needed to control WL, CG decoder & driver 51, BL decoder 53 and BL control circuit 54. The chip controller 52 also generates analog reference voltages and even high voltages which are needed for the WL, CG decoder & driver 51, BL decoder 53 and BL control circuit 54 in all operation modes. The BL decoder 53 decodes the bit lines. It selects two adjacent bit lines and passes the precharge voltage, read voltage, program voltage and erase voltage to the bit lines.

Figure 41:
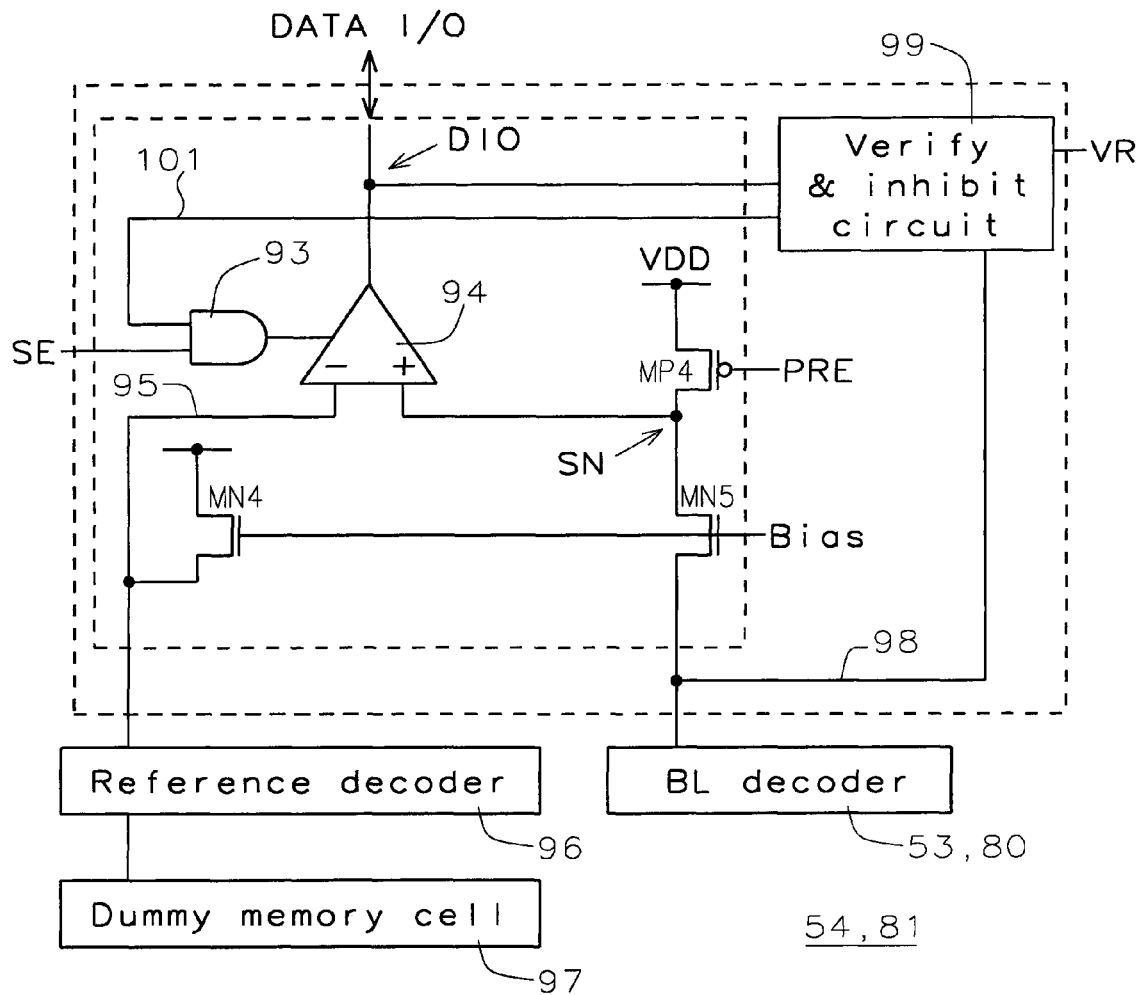
FIG. 41 shows an electrical schematic diagram of an embodiment of the BL control circuit of FIGS. 23, 24, 27, or 28.
Figure 42:
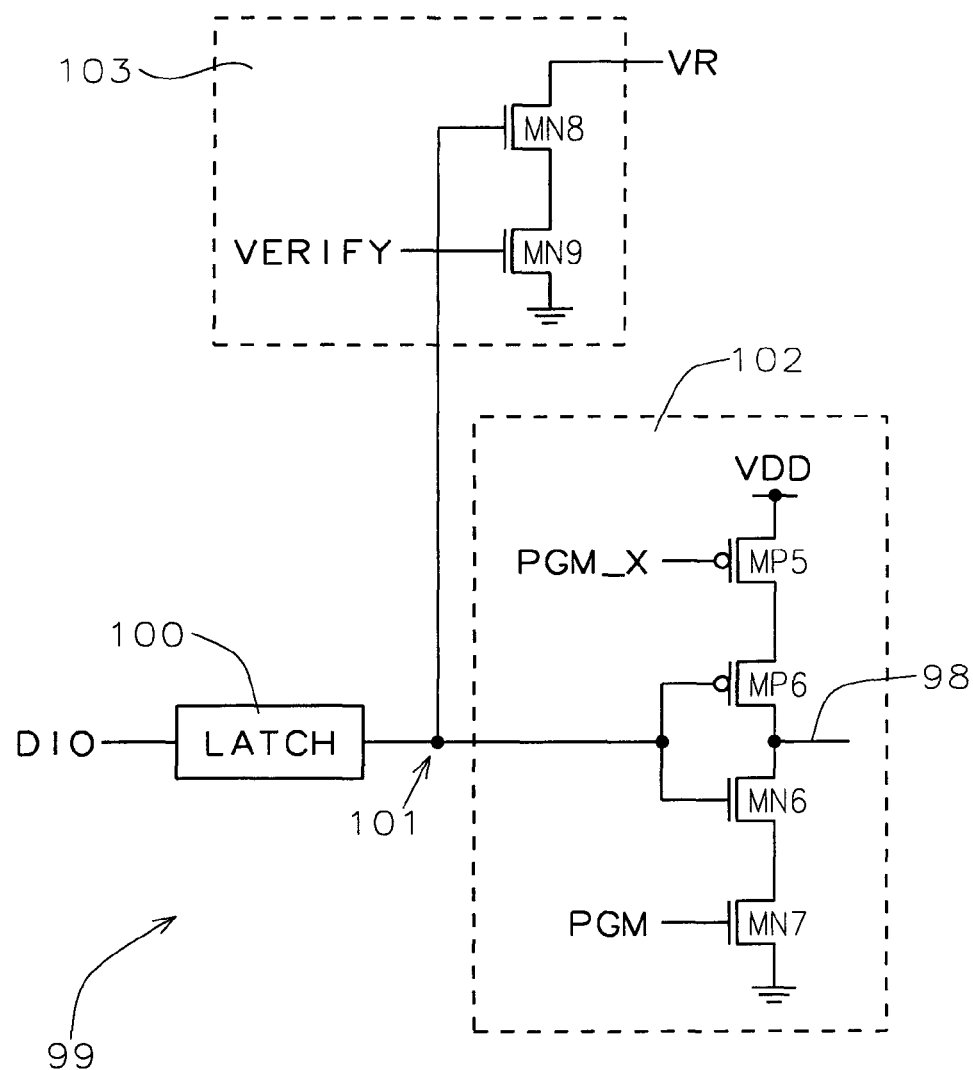
FIG. 42 shows an embodiment of the verify and inhibit circuit of FIG. 41.

The BL control circuit 54 consists of sense amplifier 94, verification circuit 103, and program inhibit circuit 102, as shown in FIGS. 41 and 42. The sense amplifier 94 detects and amplifies a signal from the selected memory cell through the bit line and BL decoder 53 during the read operation. In the read operation, the data read from the selected memory cell is output to an external device and also stored into the data latch 100 shown in FIG. 42. In the program operation, the program data is input to the data latch 100 shown in FIG. 42 from an external device. The program inhibit circuit 102 shown in FIG. 42 applies a program inhibit voltage in accordance with a data stored in the data latch 100 shown in FIG. 42 to the selected memory cell through the bit line and BL decoder 53 in order to inhibit the program of the selected memory cell. In the erase operation, erase voltage which is generated from the chip controller 52 is applied to the selected BL through BL decoder 53.

Figure 24:
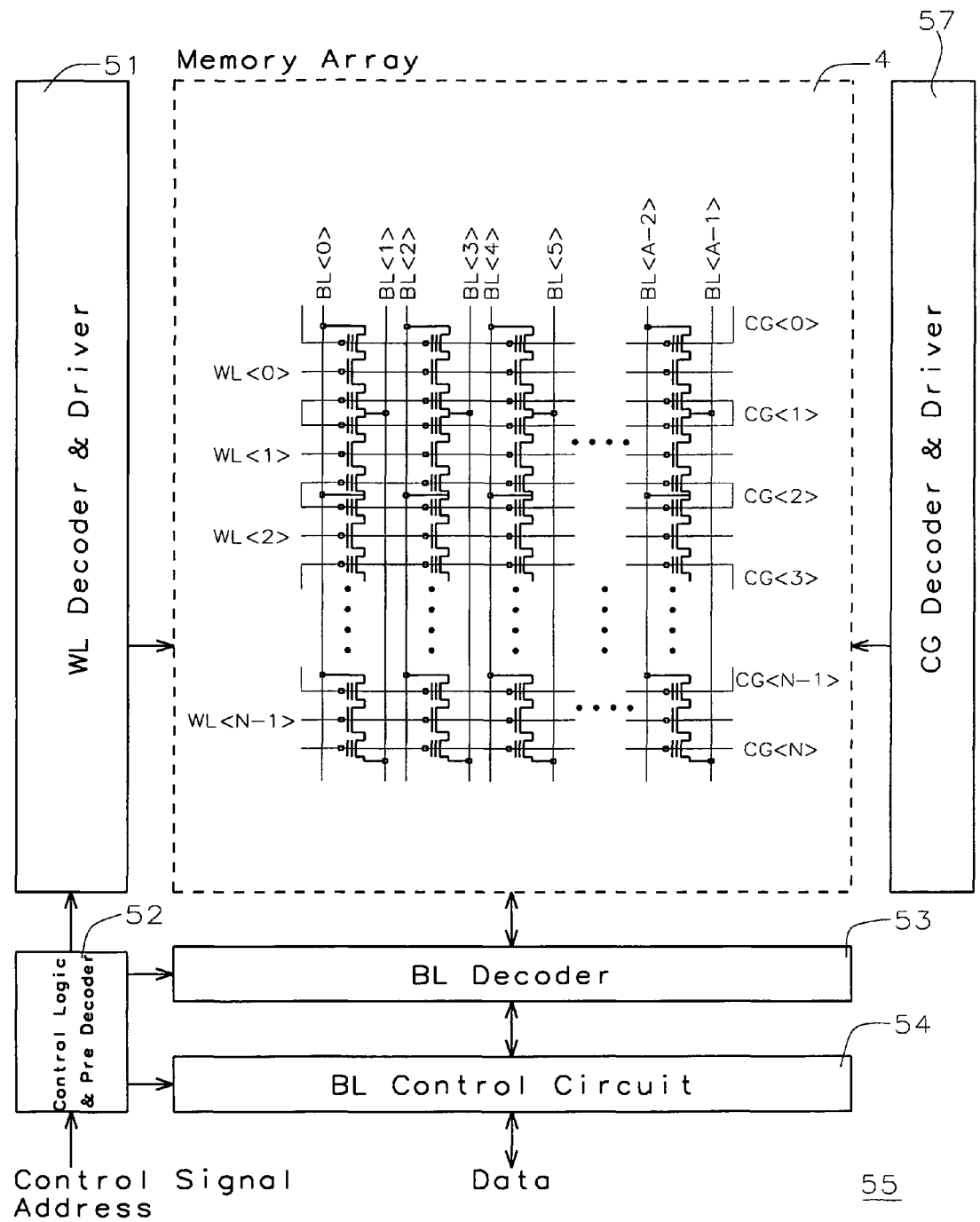
FIG. 24 shows an electrical schematic diagram of an alternative EEPROM semiconductor memory device using the metal bit twin MONOS memory array of the invention.

FIG. 24 shows an alternative EEPROM semiconductor device 55 using the Metal bit twin MONOS memory array 4. In this embodiment, WL, CG decoder & driver 51 is separated into the WL decoder & driver 56 and the CG decoder and driver 57. In the advanced technology, the pitch of WL and CG of the memory cell would be too small to implement the WL, CG decoder and driver 51 in one side of the Metal bit twin MONOS array 4. To solve this problem, WL, CG decoder and driver 51 can be separated into the two elements and put at different sides of the Metal bit twin MONOS array 4 as shown in FIG. 24. Additionally, the memory device can be also formed using another type of twin MONOS, twin MONOS for "CG shared driving" as shown in FIGS. 11-12 and FIGS. 17-18, NAND-type, AND-type, NOR-type flash memory, mask ROMs and EEPROMs though the logic of the addressing is different for each type. One WL driver is selected by the select signal from WL decoder and driver 56 and two adjacent CG drivers are selected by the select signal from CG decoder 57.

Figure 25:
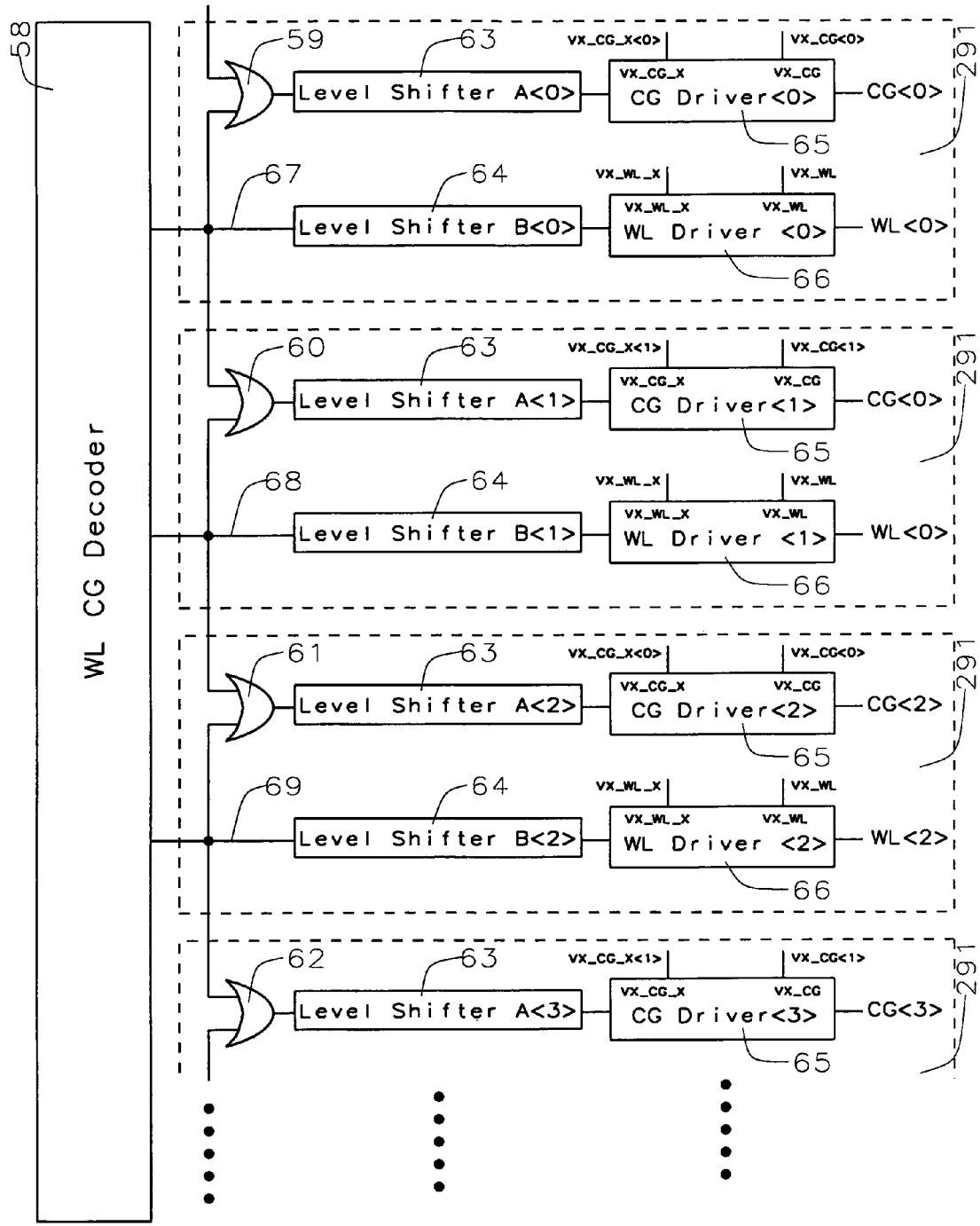
FIG. 25 shows an example of circuit configuration of the WL and CG decoder of FIG. 23.

FIG. 25 shows an example of circuit configuration of the WL and CG decoder 51 of FIG. 23. The CG and WL driver circuit unit 291 is repeated as shown in FIG. 25. Each driver has its own voltage level shifter to convert a power supply voltage to a specified voltage during operation. In this configuration, the method of decoding is simple. One WL driver and two adjacent CG drivers are selected by the select signals 67, 68, and 69 from WL CG decoder 58 as shown in FIG. 25. When signal line 68 is "H", WL<1> is selected. Additionally, CG<1> and CG<2> are selected at the same time because output of OR circuits 60 and 61 is "H".

Figure 26A:
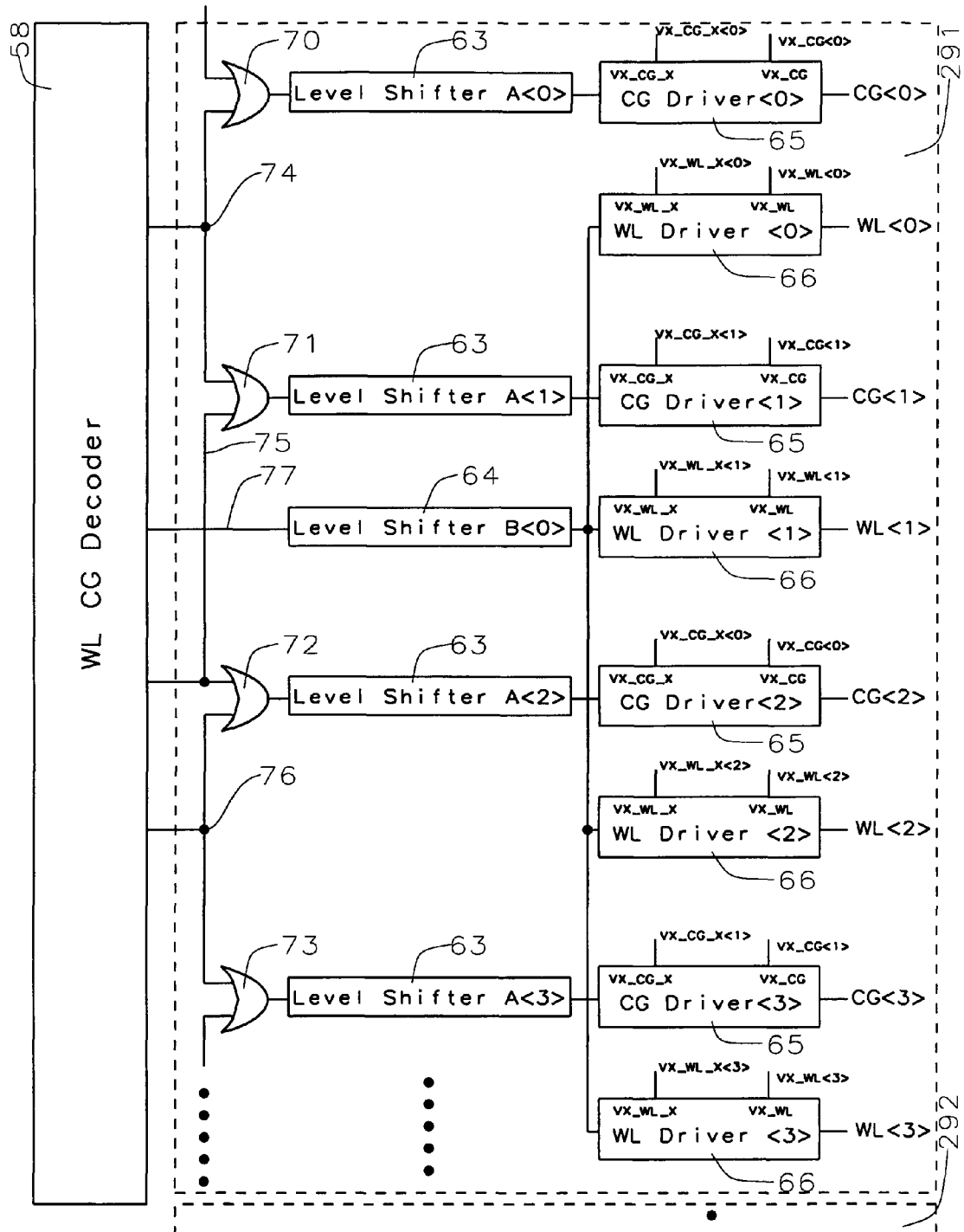
FIGS. 26A and 26B show alternative examples of circuit configuration of the WL and CG decoder of FIG. 23.
Figure 26B:
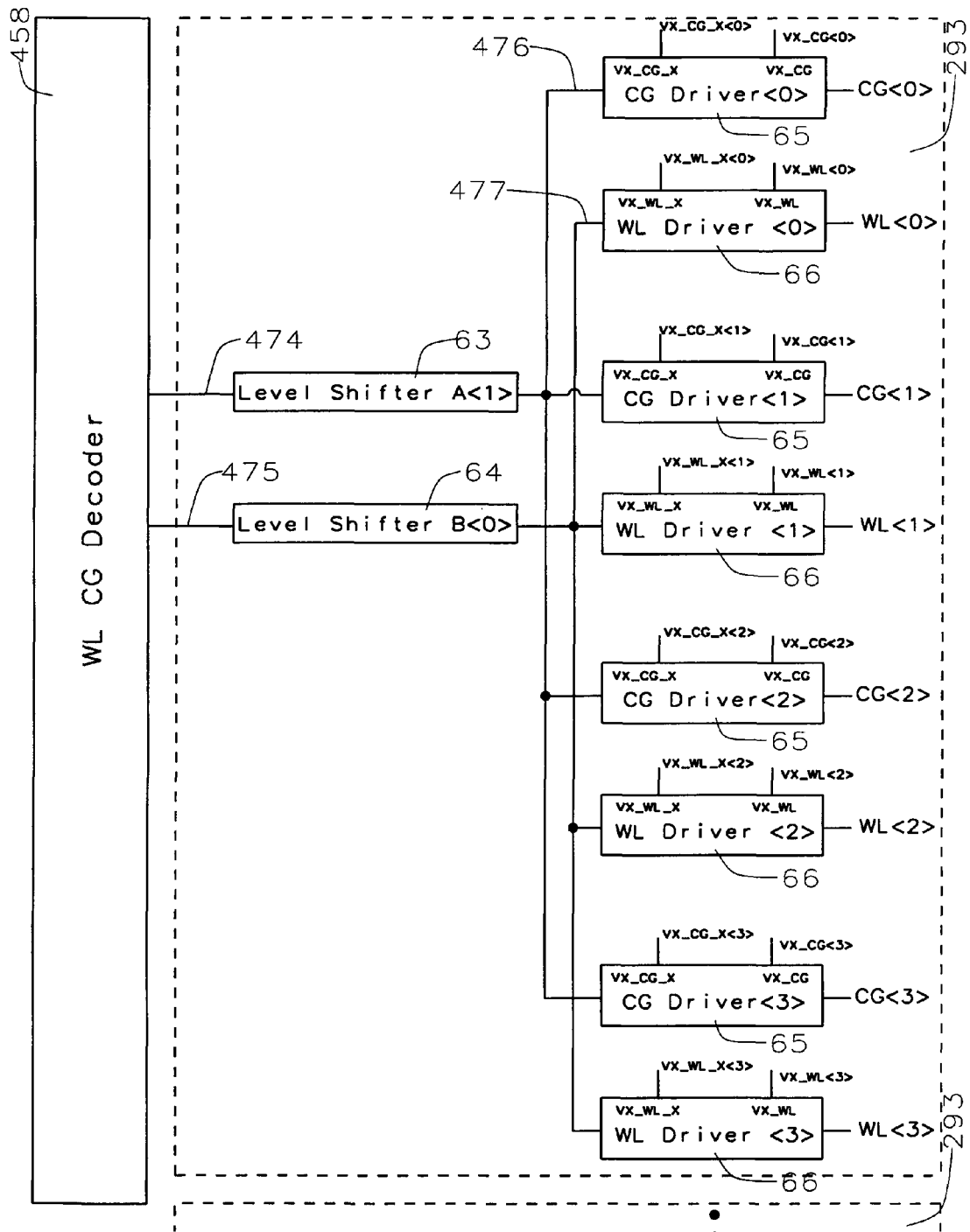

FIG. 26A shows an alternative internal circuit configuration of the WL and CG decoder 51. The CG and WL driver circuit unit 292 is repeated as shown in FIG. 26A. In this configuration, four WLs are selected by the decoded signal 77 from WL, CG decoder and two adjacent CGs are selected by the decoded signals 74, 75, and 76 from WL CG decoder 58. For example, WL<1> is selected by both the signal line 77 and the distributed power lines VX_WL<1> and VX_WL_X<1>. Both CG<1> and CG<2> are selected when the signal 75 is "H". Although the level shifter 64 is connected to four WL driver circuits 66, one WL driver 66 is selected out of four WL drivers 66 by the distributed power line VX_WL<0:3> and VX_WL_X<0:3>. In this configuration, four WL drivers 66 can share the one level shifter circuit 64. This leads to the area reduction of WL, CG decoder & driver 51. FIG. 26B shows an alternative internal circuit configuration of the WL and CG decoder 51. The CG and WL driver circuit unit 293 is repeated as shown in FIG. 26B. Not only WL distributed power lines VX_WL<0:3> and VX_WL_X<0:3>, but also CG voltage lines can be divided into the distributed power lines VX_CG<0:3> and VX_CG_X<0:3> to decode CG drivers. In this configuration, four WL drivers 66 can share one level shifter circuit 64 and four CG drivers 65 can share one level shifter circuit 63. Thus, the area of WL and CG decoder and driver can be reduced significantly.

Figure 27:
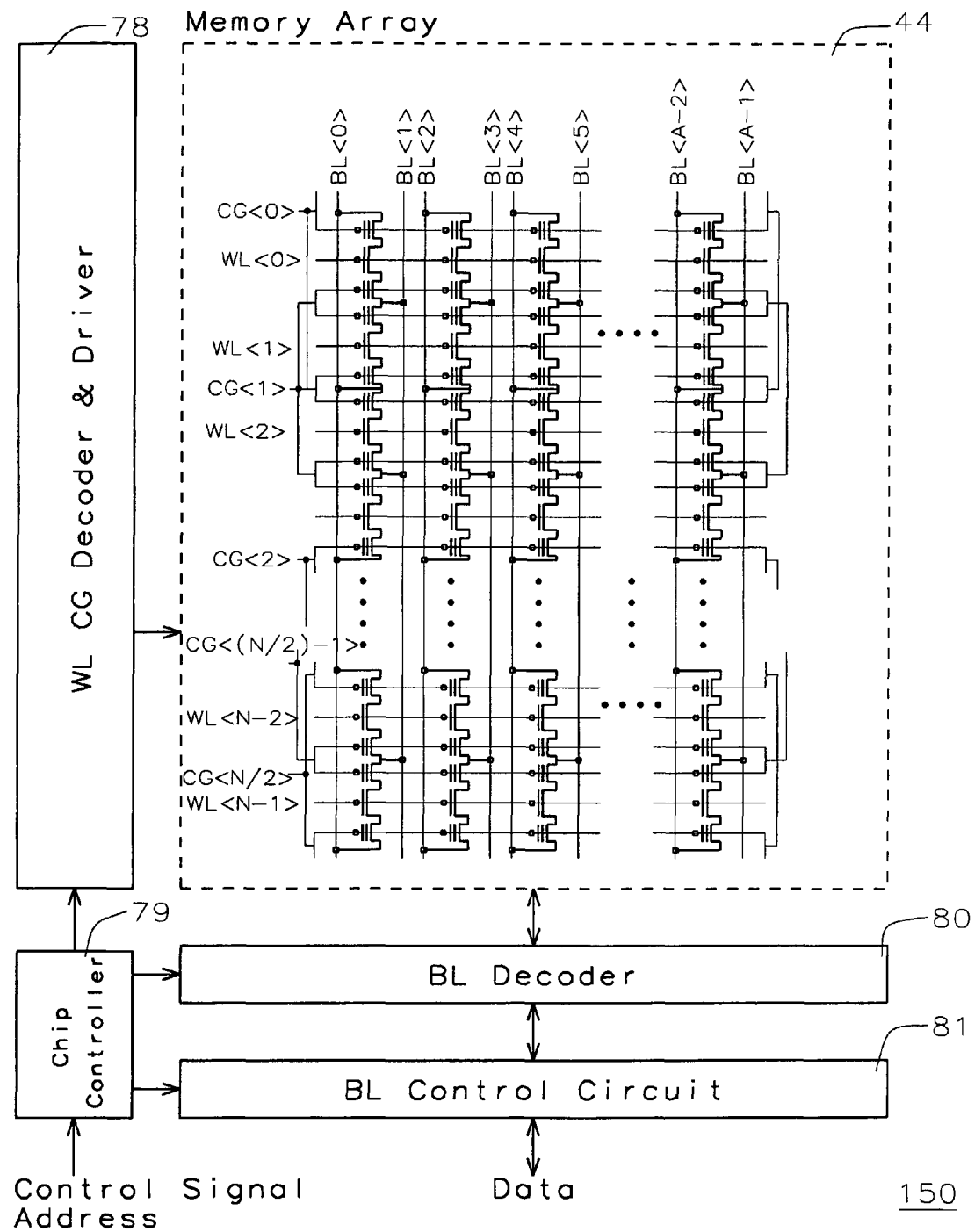
FIG. 27 shows an electrical schematic diagram of a second EEPROM semiconductor memory device using the metal bit twin MONOS memory array of the invention.

FIG. 27 shows an EEPROM semiconductor memory device 150 using the "shared CG drive" metal bit twin MONOS memory array 44.

The metal bit twin MONOS 44 comprises a plurality of word lines (WL), a plurality of bit lines (BL), a plurality of control gate lines (CG), and a plurality of twin MONOS cells. Additionally, the memory device can also be formed using another type of twin MONOS, twin MONOS with "CG shared driving" as shown in FIGS. 11-12 and FIGS. 17-18, NAND-type, AND-type, NOR-type flash memory, mask ROMs and EEPROMs though the logic of the addressing is different for each type. The EEPROM semiconductor memory device further is comprised of WL, CG decoder and driver 78, chip controller 79, BL decoder 80, and BL control circuit 81. The WL, CG decoder and driver 78 selects one WL and two CG lines that are located beside the selected WL. The WL, CG decoder and driver 78 applies a specified voltage to the selected WL and CGs in read, program, program verify, erase, and erase verify operations. In this WL, CG decoder and driver 78, WL drivers and CG drivers can share the decoder logic circuits. As a result, total area of decoder and drivers can be reduced. The chip controller 79 controls WL, CG decoder & driver 78, BL decoder 80 and BL control circuit 81. The chip controller 79 receives control and address signals from an external device and generates all signals needed to control WL, CG decoder & driver 78, BL decoder 80 and BL control circuit 81. The chip controller 79 also generates analog reference voltages and even high voltages which are needed for the WL, CG decoder & driver 78, BL decoder 80 and BL control circuit 81 in all operation modes. The BL decoder 80 decodes the bit lines. It selects two adjacent bit lines and passes the precharge voltage, read voltage, program voltage and erase voltage to the bit lines. The BL control circuit 81 consists of sense amplifier 94 shown in FIG. 41, verification circuit 103 shown in FIG. 42, and program inhibit circuit 102 shown in FIG. 42. The sense amplifier 94 detects and amplifies a signal from the selected memory cell through the bit line and BL decoder 80 shown in FIG. 27 during the read operation. In the read operation, the data read from the selected memory cell is output to an external device and also stored into the data latch 100 shown in FIG. 42. In the program operation, the program data is input to the data latch 100 shown in FIG. 42 from an external device. The program inhibit circuit 102 shown in FIG. 42 applies a program inhibit voltage in accordance with a data stored in the data latch 100 shown in FIG. 42 to the selected memory cell through the bit line and BL decoder 80 shown in FIG. 27 in order to inhibit the program of the selected memory cell. In the erase operation, erase voltage which is generated from the chip controller 79 is applied to the selected BL through BL decoder 80 shown in FIG. 27.

Figure 28:
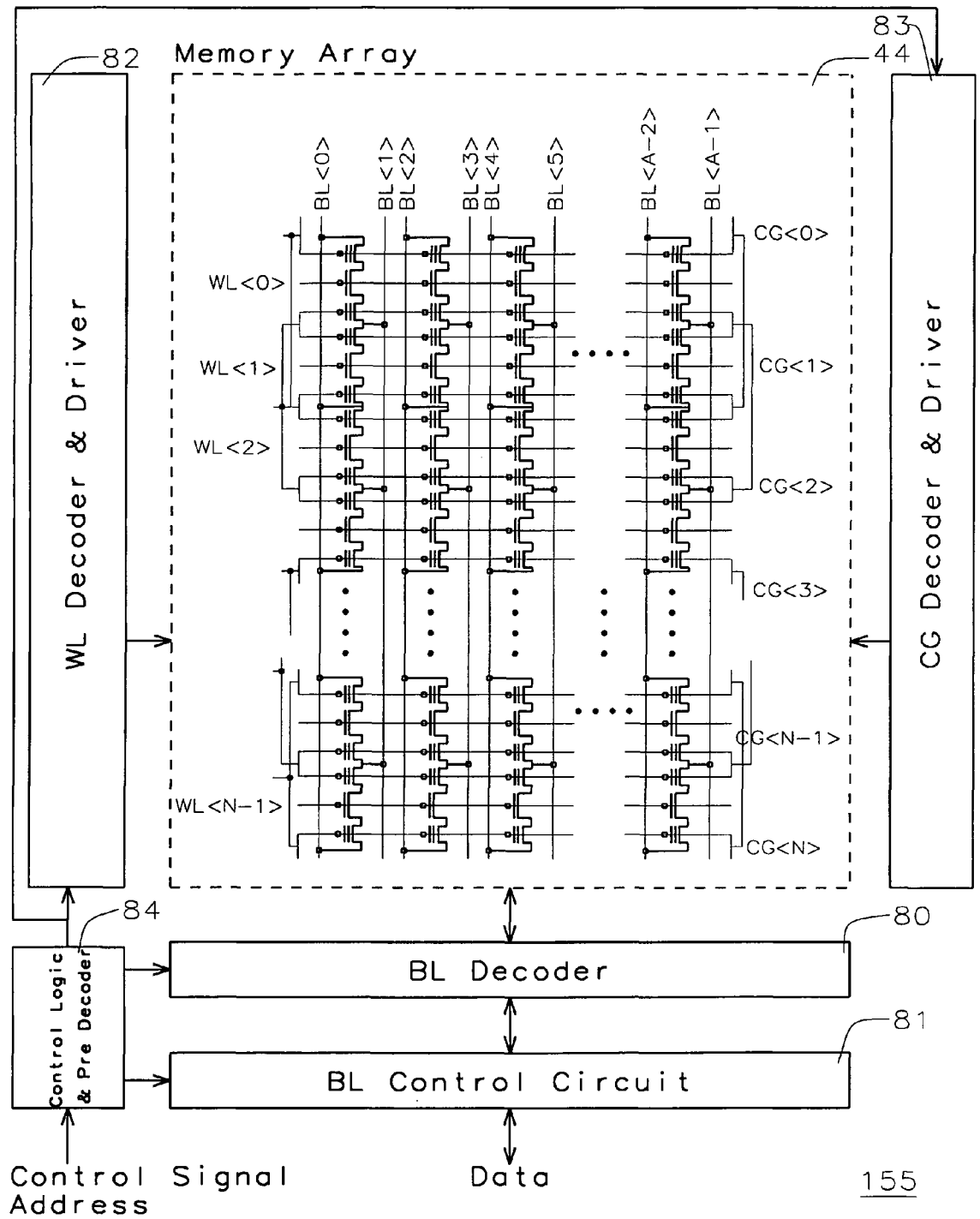
FIG. 28 shows an electrical schematic diagram of an alternative second EEPROM semiconductor memory device using the metal bit twin MONOS memory array of the invention.

FIG. 28 shows an alternative EEPROM semiconductor device 155 using the Metal bit twin MONOS 44 memory array. In this embodiment, WL, CG decoder & driver 78 is separated into the WL decoder & driver 82 and the CG decoder and driver 83. In the advanced technology, the pitch of WL and CG of the memory cell would be too small to implement the WL, CG decoder and driver 78 in one side of the Metal bit twin MONOS 44 array. To solve this problem, WL, CG decoder and driver 78 can be separated into the two elements and put at different sides of the Metal bit twin MONOS array 44 as shown in FIG. 28. Additionally, the memory device can be also formed using another type of twin MONOS, twin MONOS for "CG shared driving" as shown in FIGS. 11-12 and FIGS. 17-18, NAND-type, AND-type, NOR-type flash memory, mask ROMs and EEPROMs though the logic of the addressing is different for each type.

Figure 29:
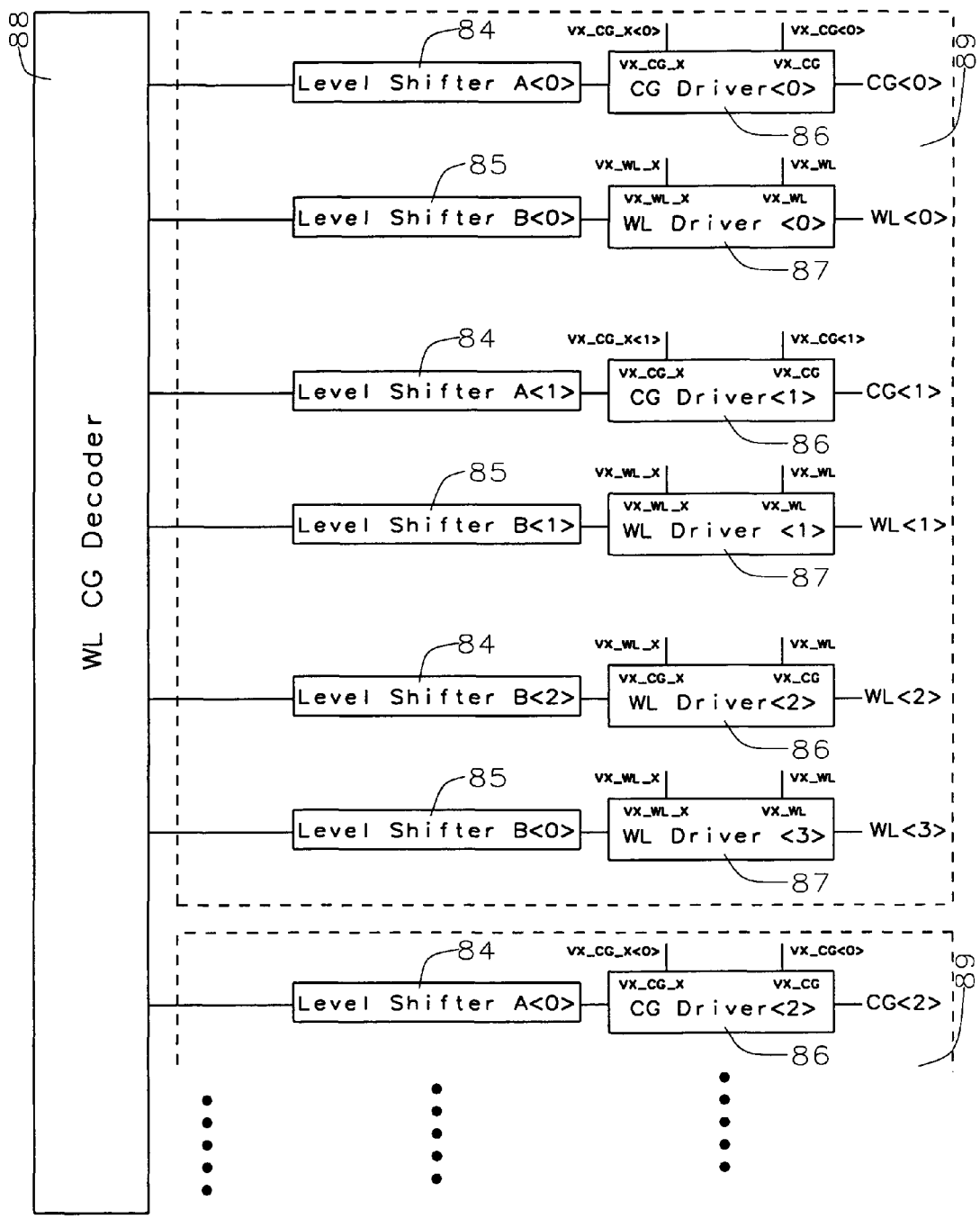
FIG. 29 shows an example of circuit configuration of the WL and CG decoder of FIG. 27.

FIG. 29 shows an example of circuit configuration of the WL and CG decoder 78. CG drivers and WL drivers are selected by the signal from WL and CG decoder 88. Each driver has its own voltage level shifter 84,85 to convert a power supply voltage to a specified voltage during operation. The elementary unit 89 consists of two CG drivers 86 and four WL drivers 87. The elementary units are placed repeatedly as shown in FIG. 29. The number of CG drivers used is reduced and the area of the WL and CG decoder 78 can be saved with this configuration. Furthermore, the method of decoding is simple.

Figure 30:
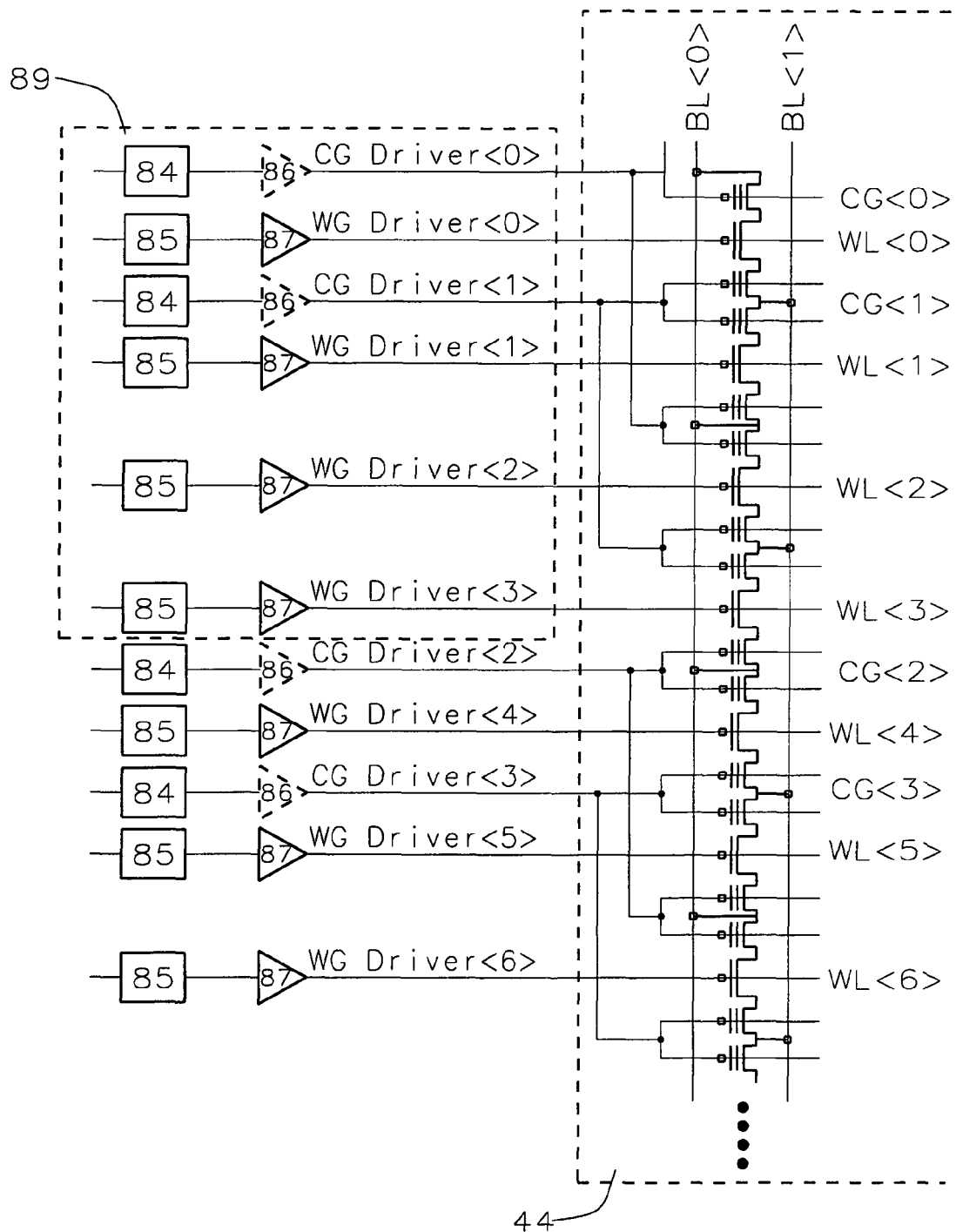
FIG. 30 illustrates how the WL and CG decoder drives the memory array of FIG. 27.

FIG. 30 illustrates how the WL and CG decoder 78 drives the memory array 44. CG driver<0> drives CG<0> and CG driver<1> drives CG<1>, and so on. WL driver<0> drives WL<0>, WL driver<1> drives WL<1>, and so on. The level shifters 84 and 85 are connected to the gate of the CG drivers 86 and WL drivers 87, respectively.

Figure 31A:
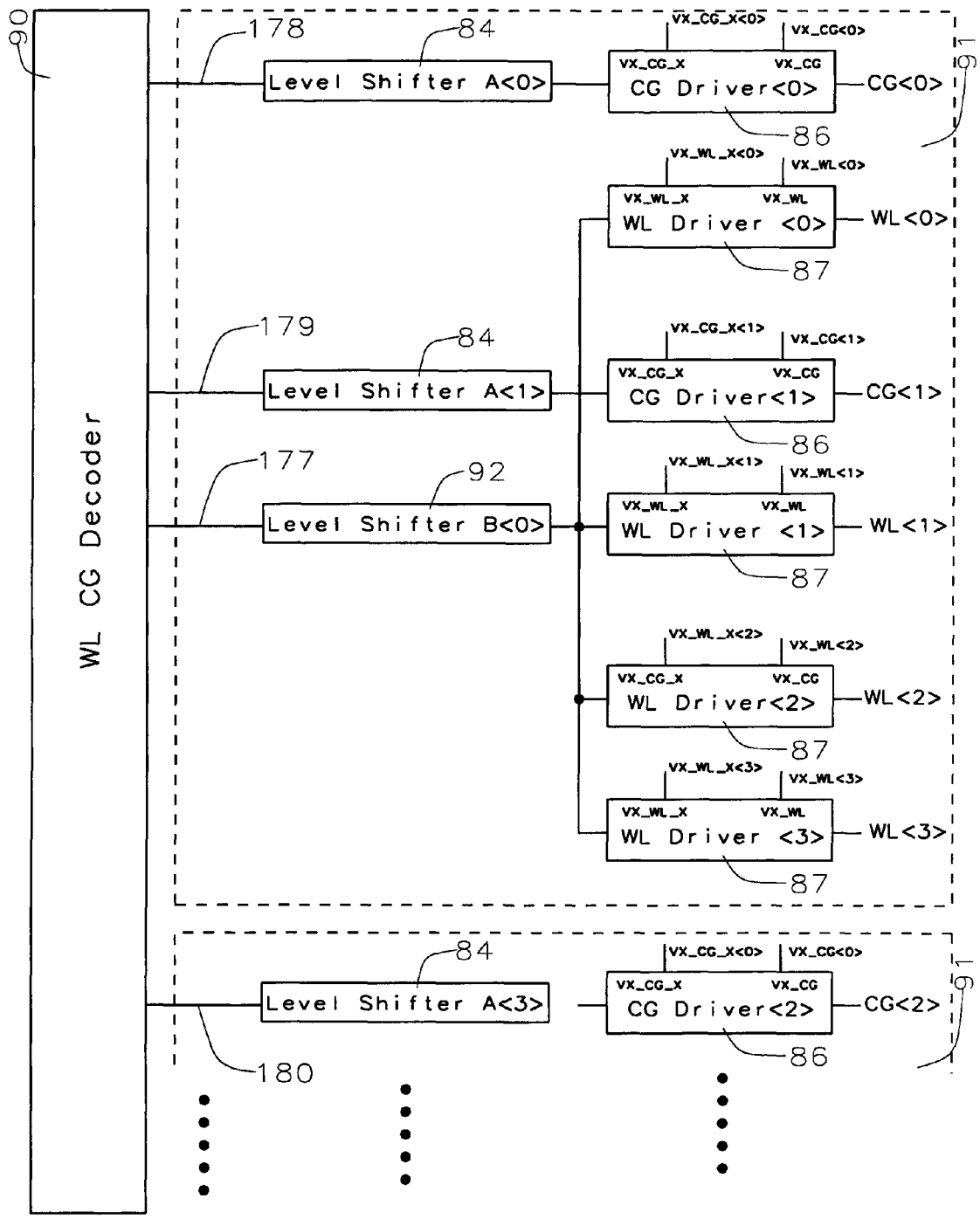
FIGS. 31A and 31B show alternative internal circuit configurations of the WL and CG decoder of FIG. 27.
Figure 31B:
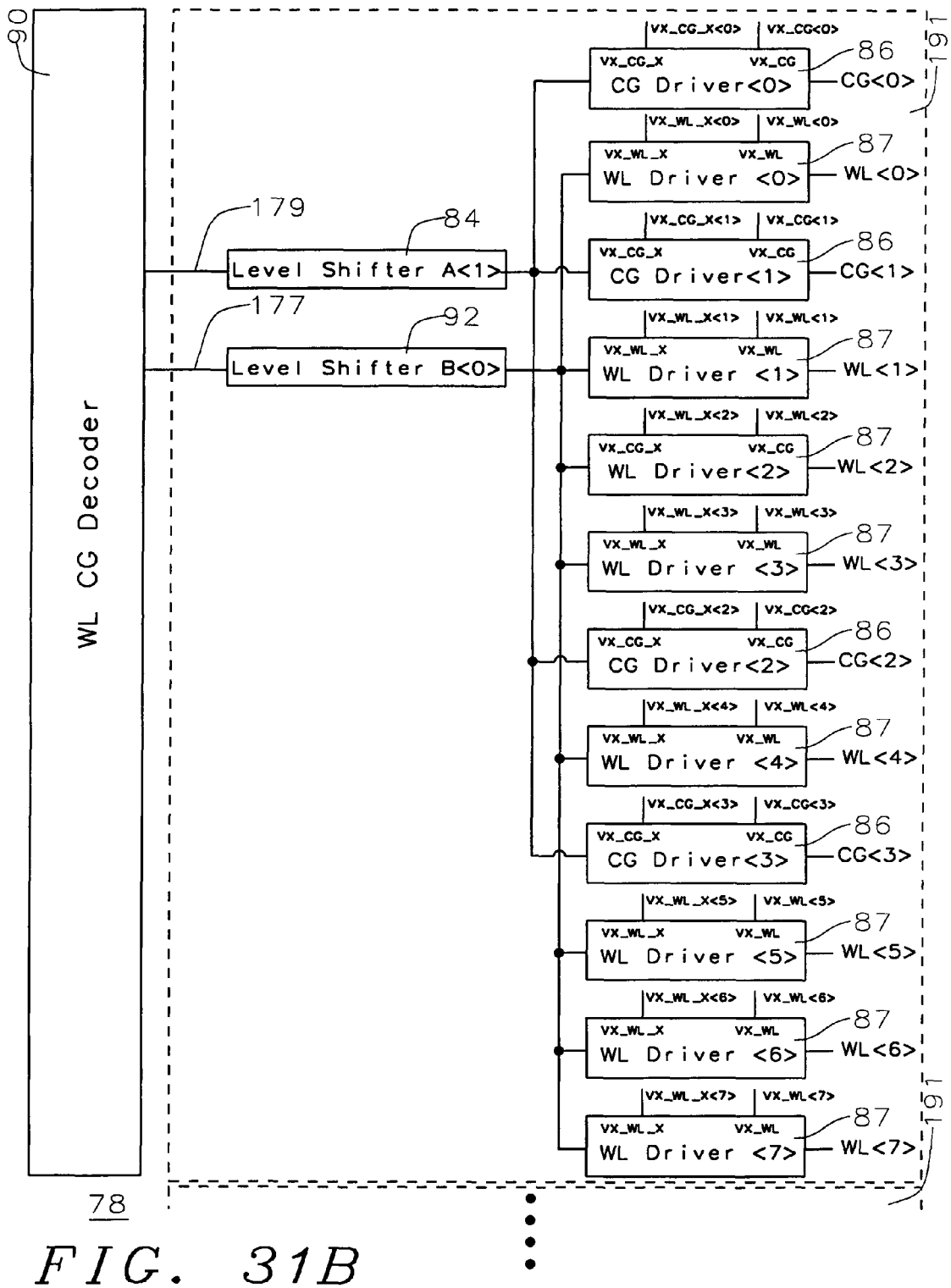

FIG. 31A shows an alternative internal circuit configuration of the WL and CG decoder 78. The CG and WL driver circuit unit 91 is repeated as shown in FIG. 31. In this configuration, four WL's are selected by the decoded signal 177 from WL CG decoder 90 and two CG's are selected by the decoded signals 178, 179, and 180 from WL CG decoder 90. Then, one WL is selected out of four WL's by the distributed power line VX_WL<0:3> and VX_WL_X<0:3>. For example, one WL is selected by the signal line 177 and VX_WL<1> and VX_WL_X<1>. In this configuration, four WL drivers can share the one level shifter circuit 92. This leads to the area reduction of WL, CG decoder & driver 78. FIG. 31B shows another alternative internal circuit configuration of the WL and CG decoder 78. In the CG and WL driver circuit unit 191, the CG and WL driver circuit unit 191 consists of eight WL drivers 87 and four CG drivers 86. One level shifter circuit 92 for WL driver 87 can be connected to more than eight WL drivers 87. (Figure not shown) And, in the CG and WL driver circuit unit 191, one level shifter circuit 84 for CG driver 86 can be connected to more than four CG drivers 86. (Figure not shown) The CG and WL driver circuit unit 191 is repeated as shown in FIG. 31B. Not only WL distributed power lines VX_WL<0:7> and VX_WL_X<0:7>, but also CG voltage lines are divided into the distributed power lines VX_CG<0:3> and VX_CG_X<0:3> to decode CG drivers 86. In this configuration, eight WL drivers can share one level shifter circuit 92 and four CG drivers can share one level shifter circuit 84. Thus, the area of WL and CG decoder and driver can be reduced significantly.

Figure 32:
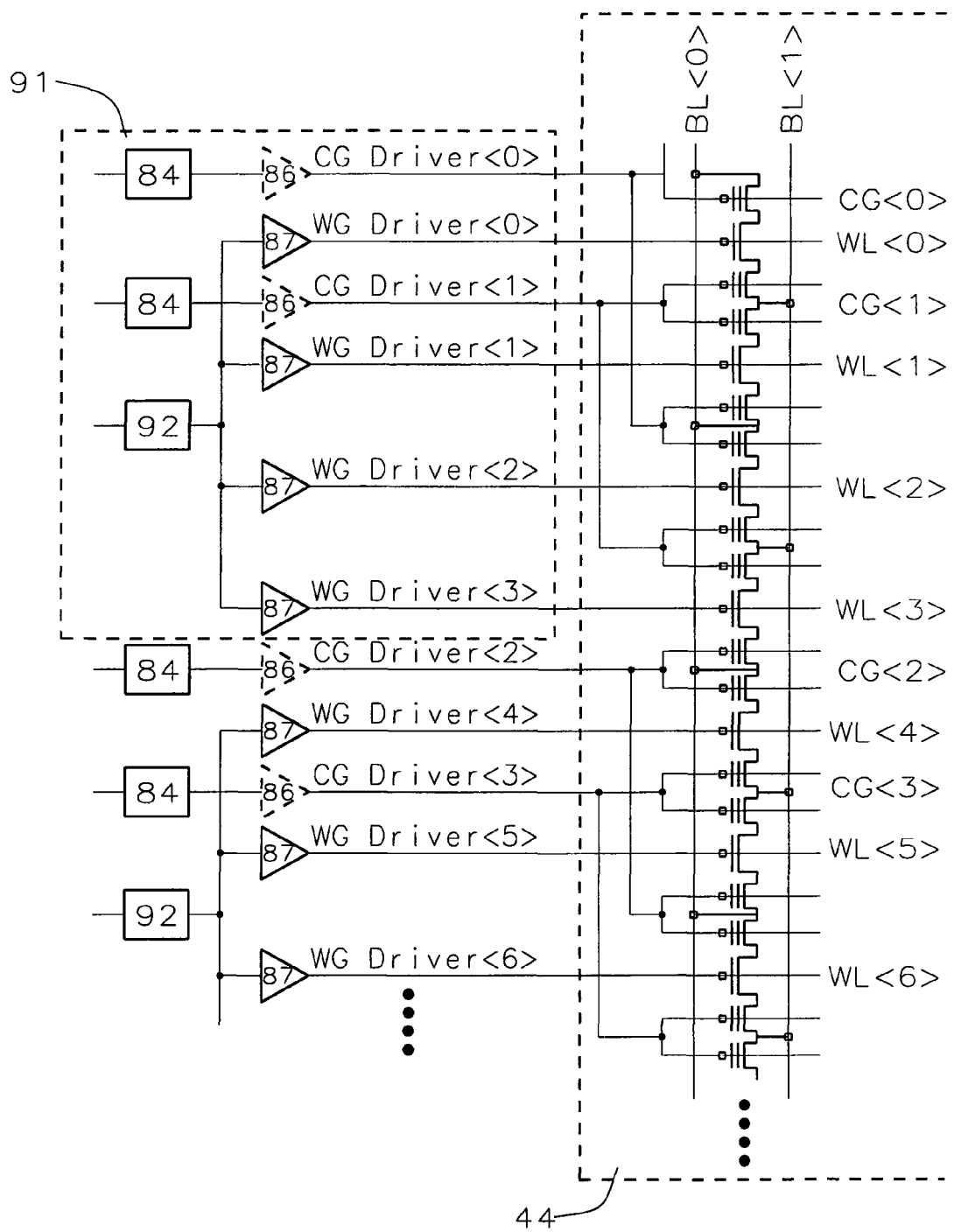
FIG. 32 illustrates how the WL and CG decoder of FIG. 27 drives the memory array.

FIG. 32 illustrates how the WL and CG decoder 78 shown in FIG. 31A or 31 B drives the memory array 44. CG driver<0> drives CG<0> and CG driver<1> drives CG<1>, and so on. WL driver<0> drives WL<0>, WL driver<1> drives WL<1>, and so on. The level shifters 84, 92 are connected to the gate of the CG drivers 86 and WL drivers 87, respectively.

Figure 33:
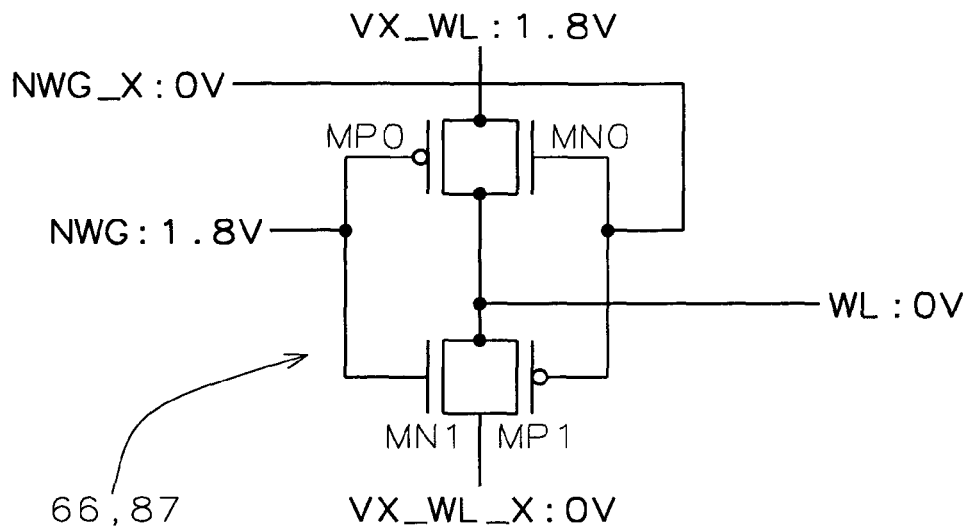
FIG. 33 shows an embodiment of the WL driver circuit of FIGS. 25, 26, 29, or 31.

FIG. 33 shows an embodiment of the WL driver circuit 66 or 87 and its voltage condition in stand-by mode. NWG, NWG_X, VX_WL and VX_WL_X are the inputs of the WL driver 66 or 87. The signal which is converted to a specified voltage by the level shifter 85 or 92 for each operation is input to NWG. NWG_X is the complementary signal of NWG. The voltage which is supposed to be applied to WL is supplied from VX_WL and VX_WL_X. WL is the output of the WL driver circuit 66 or 87. In stand-by mode, VX_WL=1.8V, VX_WL_X=0V, NWG=1.8V and NWG_X=0V. The output voltage of the WL driver 66 or 87 is 0V. To realize EEPROM, both positive and negative voltages need to be applied to WL. The CMOS WL driver such as shown in FIG. 33 is suitable for applying both positive and negative voltage to WL. However, any configuration of word gate driver circuit is applicable depending on the application.

Figure 34:
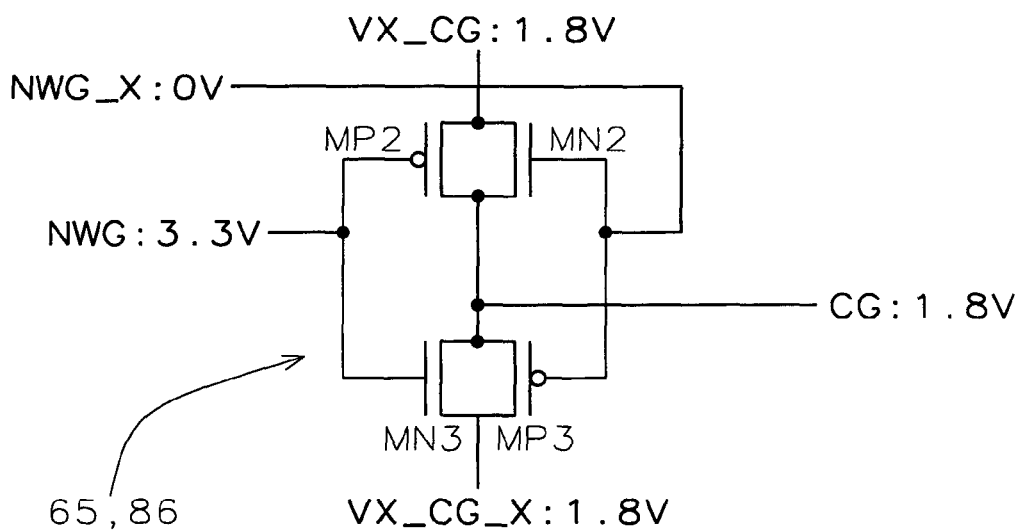
FIG. 34 shows an embodiment of the CG driver circuit of FIGS. 25, 26, 29, or 31.

FIG. 34 shows an embodiment of the CG driver circuit 65 or 86 and its voltage condition in stand-by mode. NCG, NCG_X, VX_CG and VX_CG_X are inputs of the CG driver 65 or 86. The signal which is converted to a specified voltage by the level shifter 85 or 92 for each operation is input to NCG. NCG_X is the complementary signal of NCG. The voltage which is supposed to be applied to CG is supplied from VX_CG and VX_CG_X. CG is the output of the CG driver circuit 85 or 92. In stand-by mode, VX_CG is set at around 1.8V. VX_CG_X is set at 0V~1.8V. NCG is set at 3.3V. And NCG_X is set at 0V. Then, the output voltage of CG driver 65 or 86 is 0V~1.8V in stand-by mode. To realize EEPROM, both positive and negative voltages need to be applied to CG. The CMOS CG driver shown in FIG. 34 is suitable for applying both positive and negative voltage to CG. However, any configuration of control gate driver circuit is applicable depending on the application.

Figure 35:
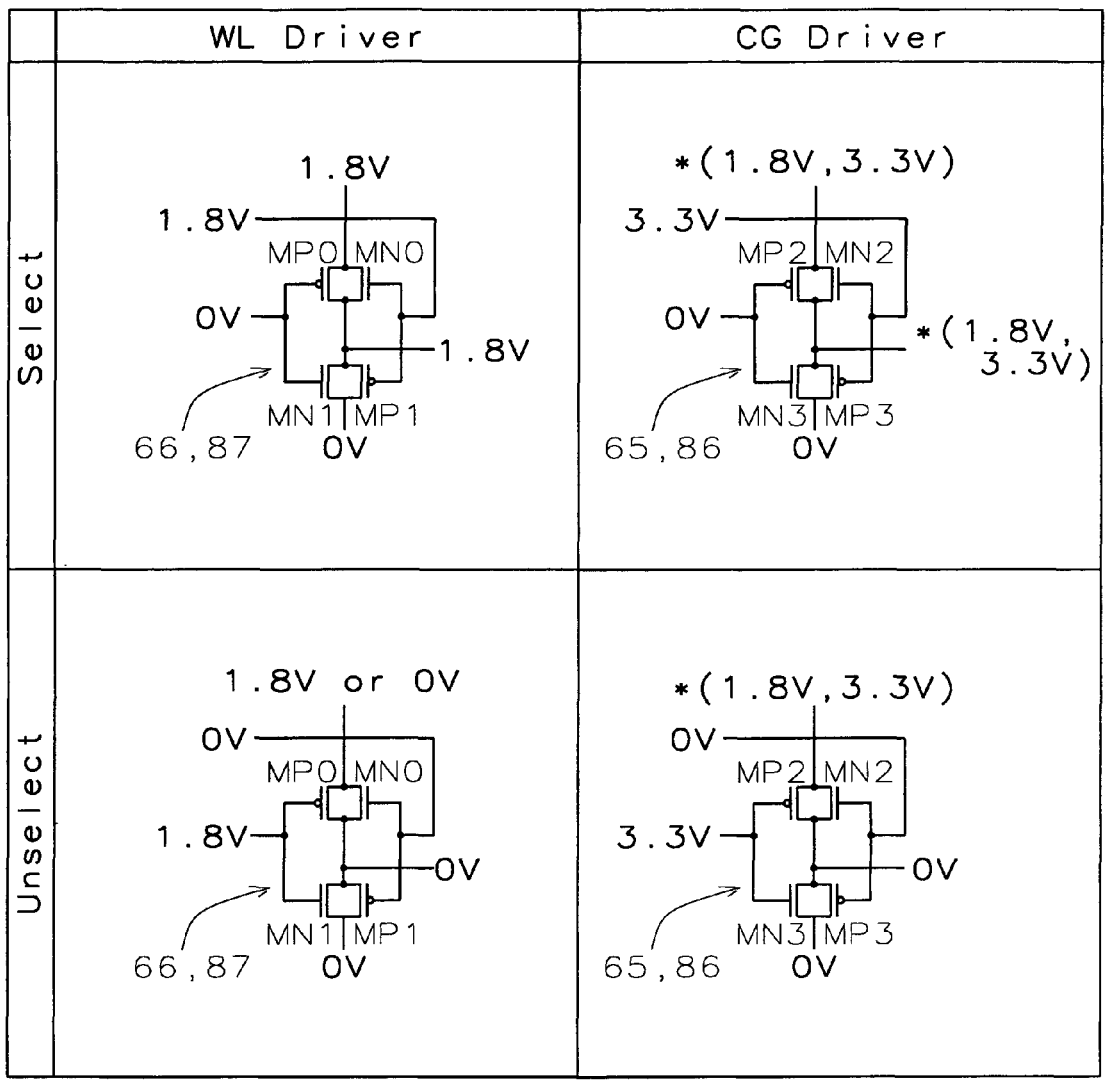
FIG. 35 shows an example of voltage conditions of WL driver and CG driver of FIGS. 25, 26, 29, or 30 in read operation.

FIG. 35 shows an example of voltage conditions of WL driver 66 or 87 and CG driver 85 or 92 in read operation. The selected WL is set at 1.8V, power supply voltage. The unselected WL's are set at 0V. The selected CG at the read side is set at 1.8V as read voltage and the selected CG at the override side is set at 3.3V. The unselected CG is set at 0V or can be set at 1.8V for high-speed read operation. By applying such target voltages above, the data of the selected twin MONOS memory cell can be read. The value of voltages described above may be modified to have another value in the practical application.

Figure 36:
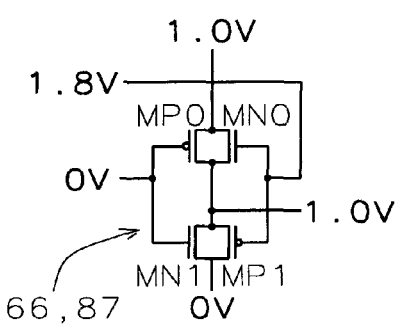
FIG. 36 shows an example of voltage conditions of WL driver and CG driver of FIGS. 25, 26, 29, or 30 in program operation.

FIG. 36 shows the voltage conditions of WL driver 66 or 87 and CG driver 85 or 92 in program operation. The selected WL is set at 1.0V. The unselected WL's are set at 0V. The selected CG at the program side is set at 5.5V and the selected CG at the override side is set at 3.3V. The unselected CG is set at 0V. Thus, the selected twin MONOS memory cell can be programmed. The value of voltages described above may be modified to have another value in the practical application.

Figure 37:
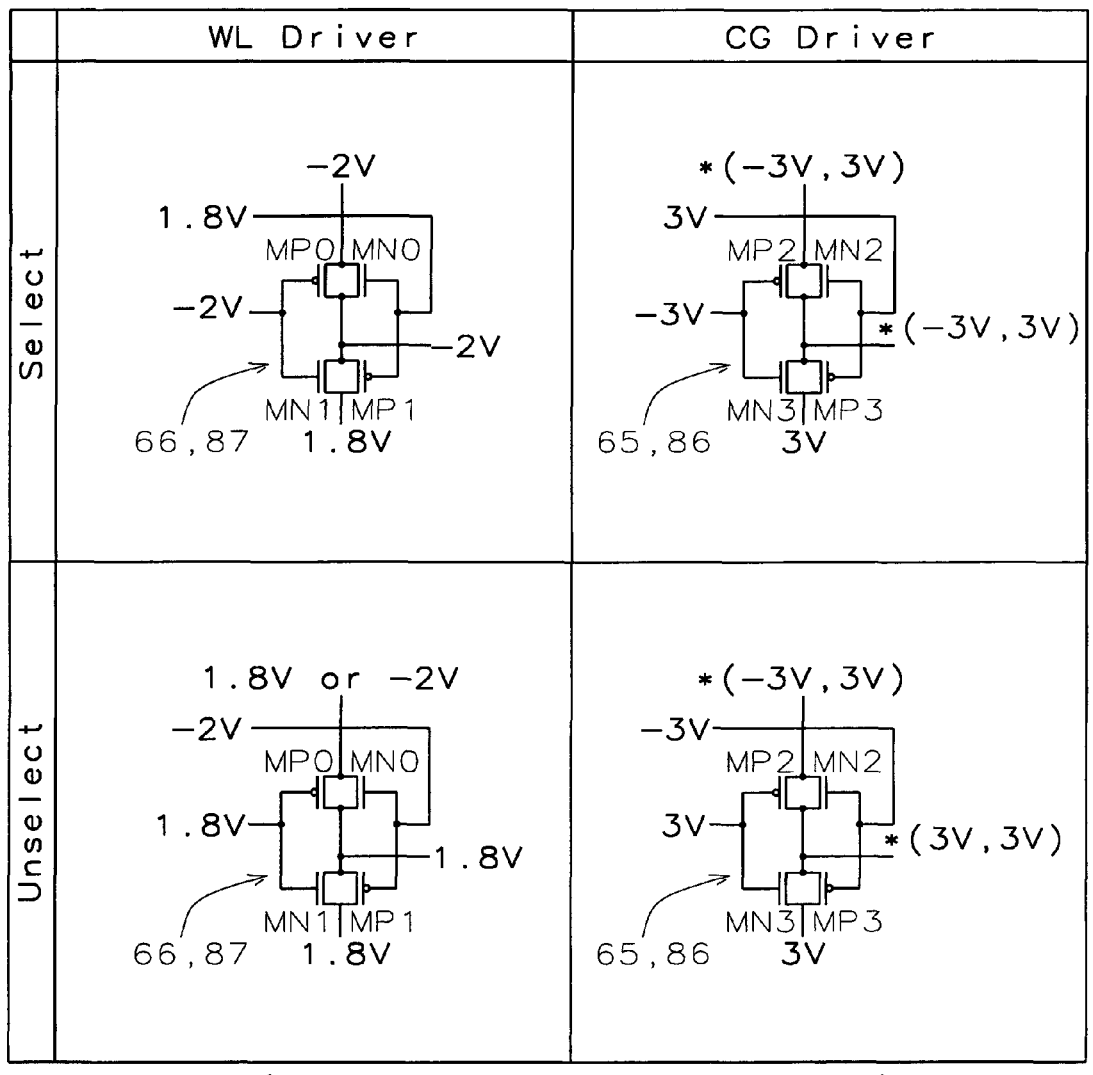
FIG. 37 shows an example of voltage conditions of WL driver and CG driver of FIGS. 25, 26, 29, or 30 in erase operation.
Figure 38:
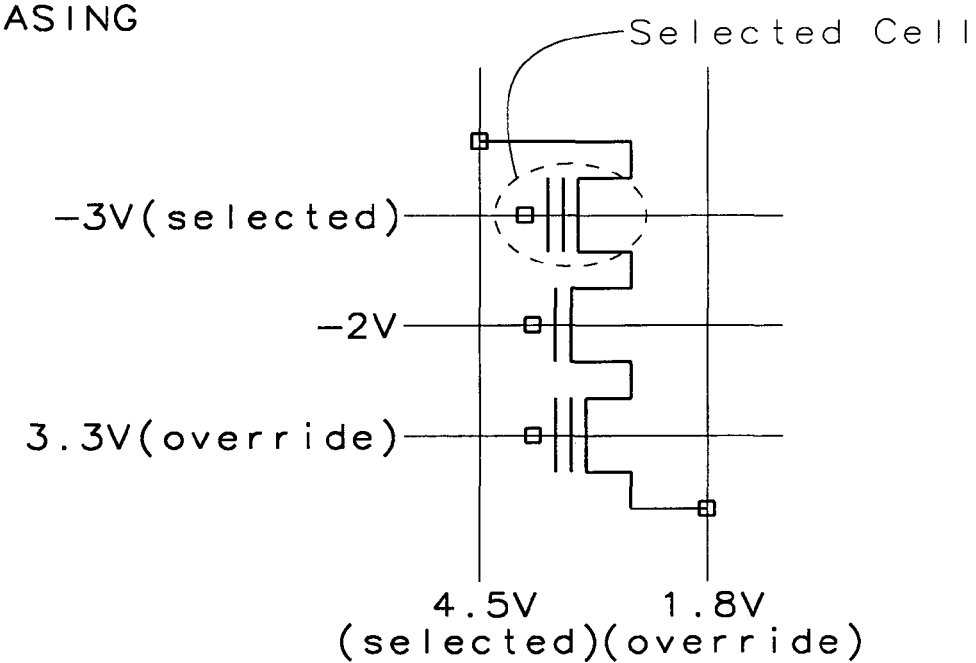
FIG. 38 shows an electrical schematic diagram of erase and erase inhibit operation of FIG. 37.
Figure 38:
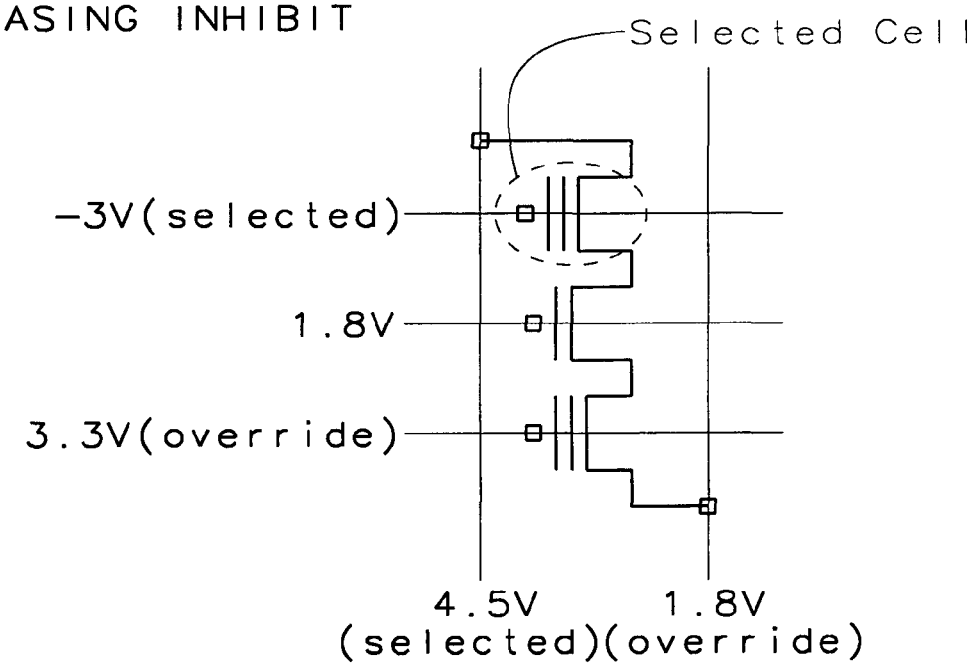

FIG. 37 shows the voltage conditions of WL driver 66 or 87 and CG driver 65 or 86 in erase operation. The selected WL is set at −2.0V. The unselected WL's are set at 1.8V. The selected CG at the erase side is set at −3.0V and the selected CG at the override side is set at 3.3V. The unselected CG is set at 3V. The selected bitline at the erase side is set 4.5V and the bitline at the override side is set to 1.8V. In this condition, only the cell with −3V at CG, −2V at WL, 4.5V at BL is erased, but the cell with −3V at CG, 1.8V at WL, 4.5V at BL cannot be erased due to inhibition of band-to-band hot-hole generation in the condition, as shown in FIG. 38. This erase method has been previously described in U.S. Pat. No. 6,255,166, assigned to the same assignee as the present invention and herein incorporated by reference in its entirety. Thus, only the selected twin MONOS memory cell can be erased without disturbing the unselected memory cell. That means memory devices 50, 55, 150, and 155 can work as byte erasable EEPROM unlike the conventional flash memory which can only erase block by block. The value of the voltages described above may be modified to have another value in the practical application.

Figure 39:
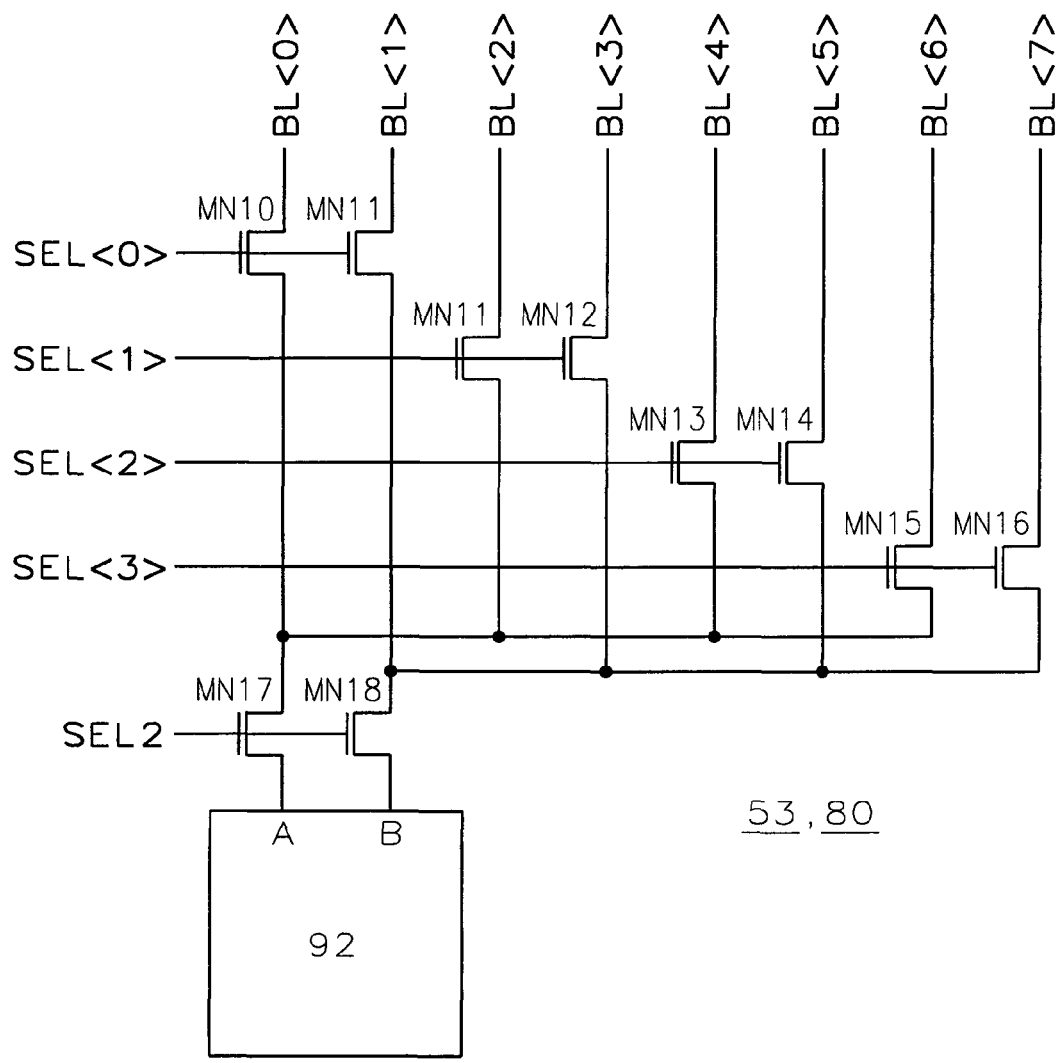
FIG. 39 shows an embodiment of BL decoder unit of FIGS. 23, 24, 27, and 28.

FIG. 39 shows an embodiment of BL decoder unit 53 or 80. SEL1<0:3> and SEL2 are the select signals to select the specific BL's. The voltage switch circuit 92 supplies the voltages to the selected BL's in each operation. This decoder selects two adjacent BL's in the Metal bit twin MONOS 4 out of any number of the BL's, for example, 16, 32 or 64 although only 8 bit lines BL<0:7> are shown in FIG. 39. Additionally, although the number of the decoding stage is two in FIG. 39, further decoding stages, for example, 3, 4 or 50 can be used. This BL decoder unit 53 or 80 is repeated along the bitline of the memory array 4 or 44 (in FIGS. 23, 24/29, and 30). The configuration of the BL decoder circuit can be changed in case another type of memory array is used.

Figure 40:
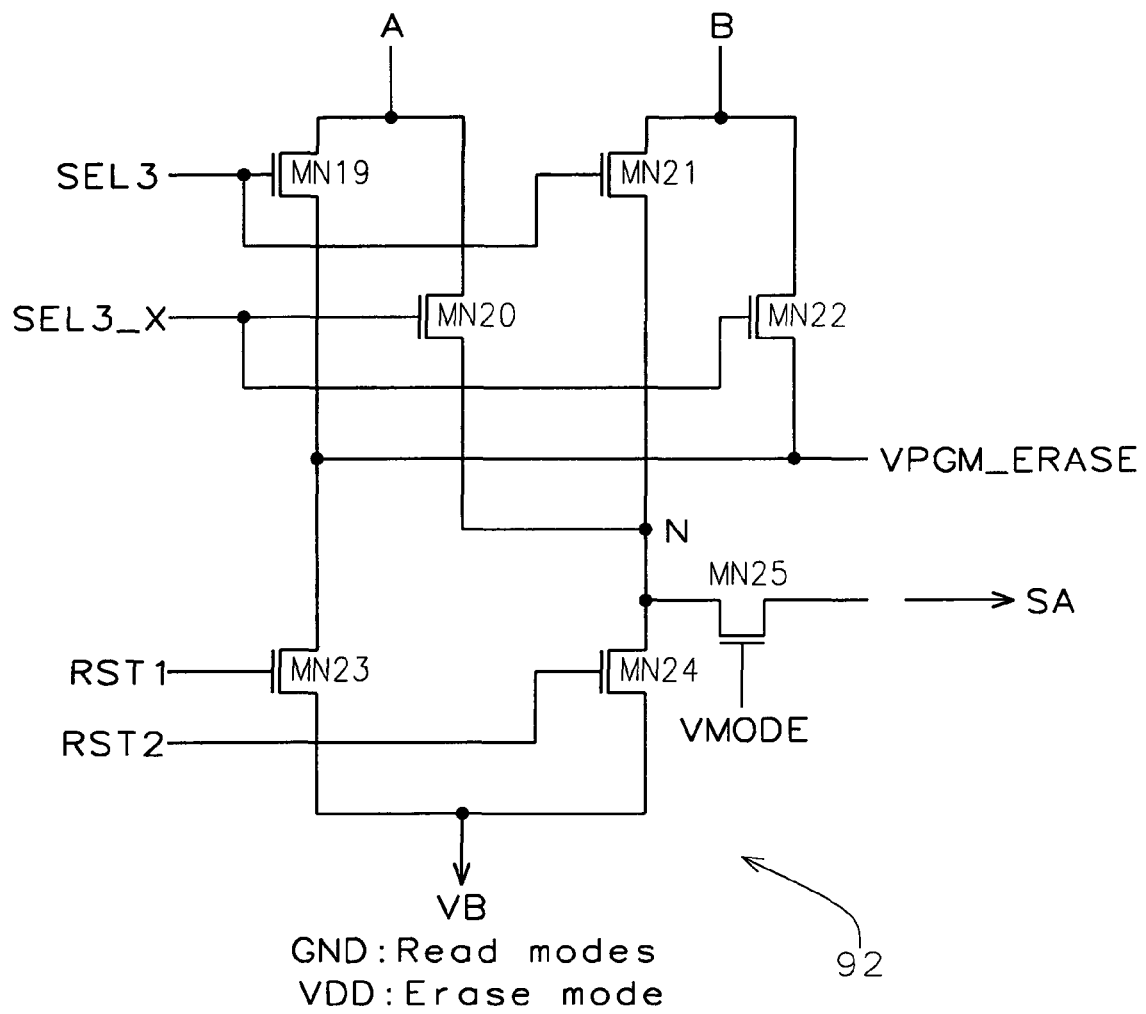
FIG. 40 shows an electrical schematic diagram of an embodiment of the voltage switch circuit of FIG. 39.

FIG. 40 shows an embodiment of the voltage switch circuit 92. SEL3 is the selected signal. SEL3_X is the complementary signal of SEL3. RST1 and RST2 are reset signals to supply 0V or 1.8V to BL's through VB during read & program operations and erase operation, respectively. MN25 is the protection transistor for the sense amplifier to decouple from the high voltage during the program and erase operation. VMODE is the mode signal which is set in "H" level and connects the node N to the sense amplifier (SA) and verify circuit in read and program operations. The nodes A and B are the outputs of the voltage switch circuit 92. The program and erase voltages applied to the selected memory cell are supplied from VPGM_ERASE. When SEL3 is set in "H" level (SEL3_X is set in "L" level), the output A is connected to VPGM_ERASE and the output B is connected to the node N. When SEL3 is set in "L" level (SEL3_X is set in "H" level), the output A is connected to the node N and the output B is connected to VPGM_ERASE. In read operation, VMODE is changed to "H" level and VPGM_ERASE is changed to 0V. Either the output A or the output B is connected to the sense amplifier (SA) through MN25 or VPGM_ERASE, respectively.

FIG. 41 shows an embodiment of the BL control circuit 54 or 81. BL control circuit 54 or 81 consists of the sense amplifier 94, precharge transistor MP4, the bit line bias voltage control transistors MN5 and MN4, and verify & inhibit circuit 99. The sense amplifier 94 can be formed using conventional circuits such as a differential amplifier, cross-coupled CMOS amplifier, and so on. The PRE is a precharge control signal. The Bias is the precharge and sensing voltage control signals. The SE is the sense amplifier enable signal. The SN is a sensing node for the sense amplifier 94. The DIO is the data input and output node. The reference bit line 95 is coupled to the reference decoder circuit 96 and bit line bias voltage control transistor MN4. The reference decoder 96 is connected to dummy memory cell 97. The dummy memory cell 97 is placed in the same memory cell array as the selected memory cell and is connected to the reference decoder 96 so that the reference bit line has almost the same load characteristic as the memory cell bit line. The reference read path is also identical to the read path for the selected memory cell 4 or 44 and its output is coupled to the negative terminal of sense amplifier 94. Also, the read method referred to in U.S. Pat. 6,038,169, assigned to the same assignee as the present invention and herein incorporated by reference in its entirety, can be applicable to a twin MONOS metal bit array. In the read operation, the precharge signal PRE is set in "L" level and the bit line voltage control signal, Bias, is set in a specified voltage to determine a precharge voltage for the selected bit line and the dummy memory cell 97. If the selected cell has a low threshold and a logical value of "1", the voltage of the node SN decreases. If the selected cell has a high threshold and a logical value of "0", the voltage of the node SN stays at the precharged voltage. Then the sense amplifier 94 detects the voltage difference between the reference bit line 95 and the sense node SN. During the program phase in program operation, the precharge signal PRE is set in the "H" level and the bit line voltage control signal Bias is set in the "L" level to separate the node SN from the BL's. However, during the verify phase in program operation, the precharge signal PRE is set in "L" level and the precharge voltage control signal Bias is set in a specified voltage to determine a precharge voltage for the selected bit line and the dummy memory cell 97. When the node 101 is set in "H" level and the sense amplifier enable signal SE is set in "H", the sense amplifier 94 is activated. Normally, the node 101 is in "H" level by resetting the data latch in the verify & inhibit circuit 99. In the erase operation, the precharge signal PRE is set in the "H" level and the bit line voltage control signal Bias is set in the "L" level to separate the node SN from the BL's.

Figure 43:
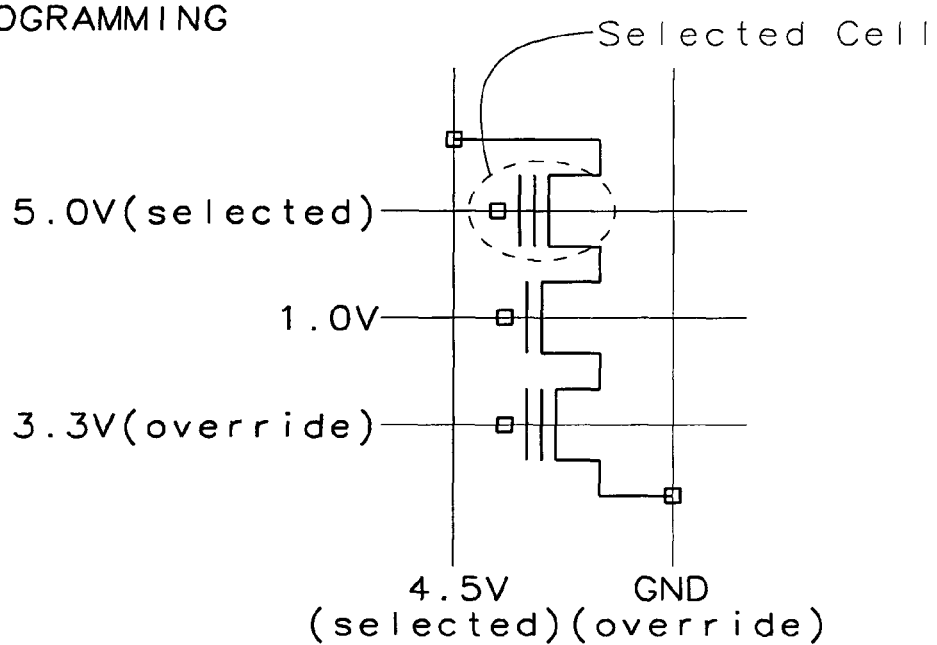
FIG. 43 shows a schematic diagram of program and program inhibit operation of FIG. 42.
Figure 43:
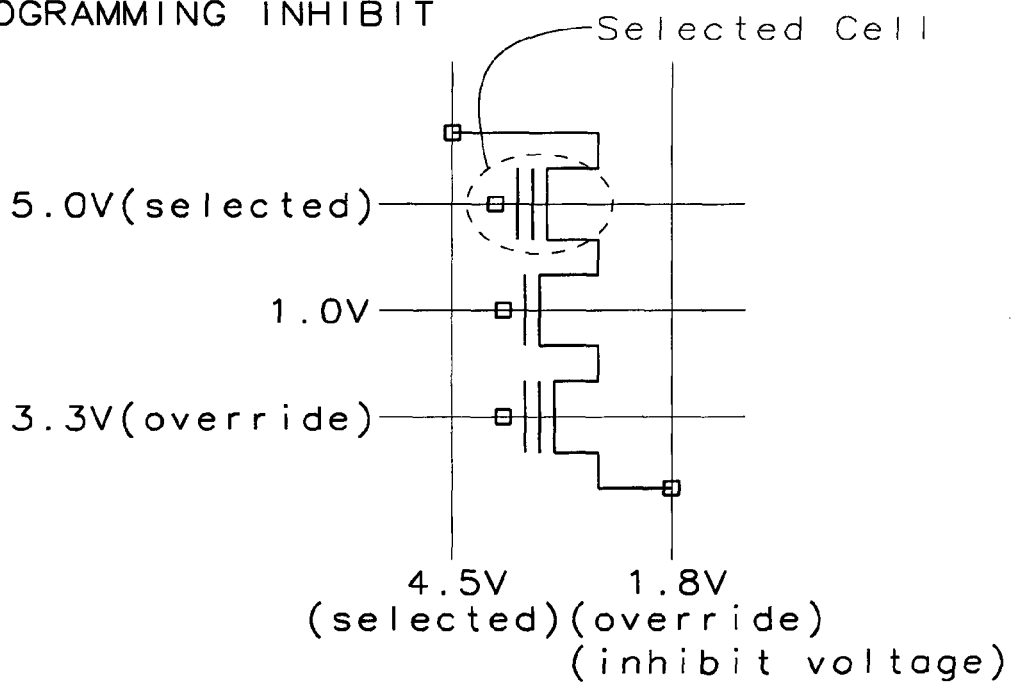

FIG. 42 shows an embodiment of verify and inhibit circuit 99. The DIO is the data output node. PGM is the program status signal which is set in "H" level in the program operation. The VERIFY is the verify status signal to send the verify result to the chip controller 52. The Data latch 100 holds the read and program data from the sense amplifier and the external device, respectively. The verify circuit is composed of low voltage NMOS transistors, MN8-MN9. The VR node is shared with other verify circuits in the BL control circuit and is connected to the chip controller by a wired-OR circuit. In the verify phase of program operation, the VR node is precharged to power supply voltage, normally VDD. When VERIFY is set in "H" level and the data in the latch is in "H" level that means the selected memory cell is erased; the VR node voltage is discharged. If all selected memory cells are programmed, the data in the latch are set to "L" level so that the precharged voltage at the VR node remains. The program inhibit circuit 102 outputs the program inhibit voltage, VDD in this embodiment, depending on the state of the data stored at the data latch 100 during the program operation. If the selected memory cell is detected as "programmed", the voltage of the node 101 and the data node DIO in the data latch circuit 100 become "L" level so that the verify circuit outputs the power supply voltage VDD as the program inhibit voltage to the bit line of the selected memory cell at the override side in the next program cycle, as shown in FIG. 43. If the selected memory cell is detected as "erased", the voltage of the node 101 and the data node DIO in the data latch circuit 100 changes to "H" level so that the verify circuit produces GND voltage to the bit line of the selected memory cell at the override side in the next program cycle, as shown in FIG. 43.

Figure 44:
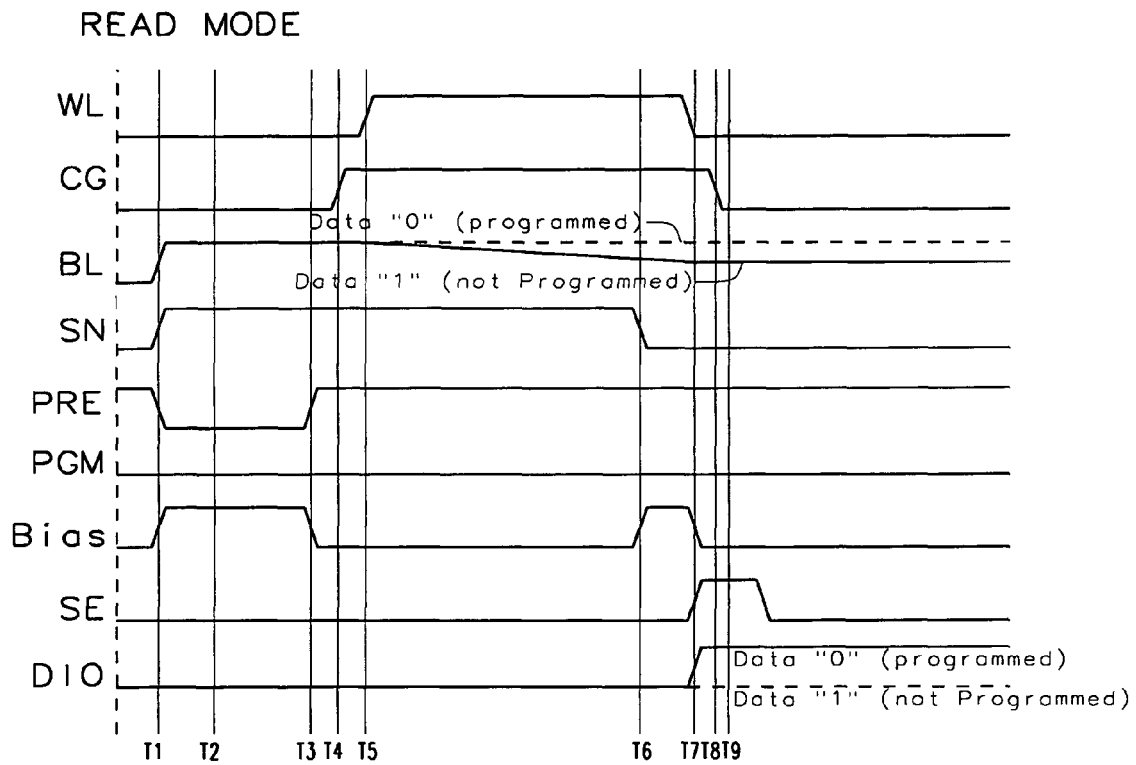
FIG. 44 shows a timing chart explaining how the data is read from any selected memory cell.

FIG. 44 shows a timing chart explaining how the data is read from any selected memory cell. The read operation is started by precharging the selected bit lines and setting the data latch as shown in T1-T3 time of FIG. 44. The selected BL is precharged at 1.8V. Then, selected CG's and WL are turned on at T4 and T5, respectively, so that it starts to develop a cell current. 1.8V is applied at the read side CG, 3.3V is applied to the override side CG, then 1.8V is applied to the selected WL. If the selected memory cell is programmed, the cell current is very low so that the precharged bit line voltage may remain at 1.8V until the sense amplifier 94 is activated by the sense enable control signal, SE at T7. The sensing node SN voltage also remains at high state so that the output of the sense amplifier becomes "H" at T7. If the selected memory cell is erased, the cell current is high enough to discharge the bit line voltage so that the sensing node SN voltage starts to discharge from precharged VDD at T5. After SE is set in "H" level, DIO becomes "L" level. The state of DIO is transferred to the external I/O device. At the same time, the read data is transferred to the data latch 100. The value of voltages described above may be modified to have another value in the practical application for using the read operation of the present invention. The same is true for the timing of the signals and the time length of the signals.

Figure 45:
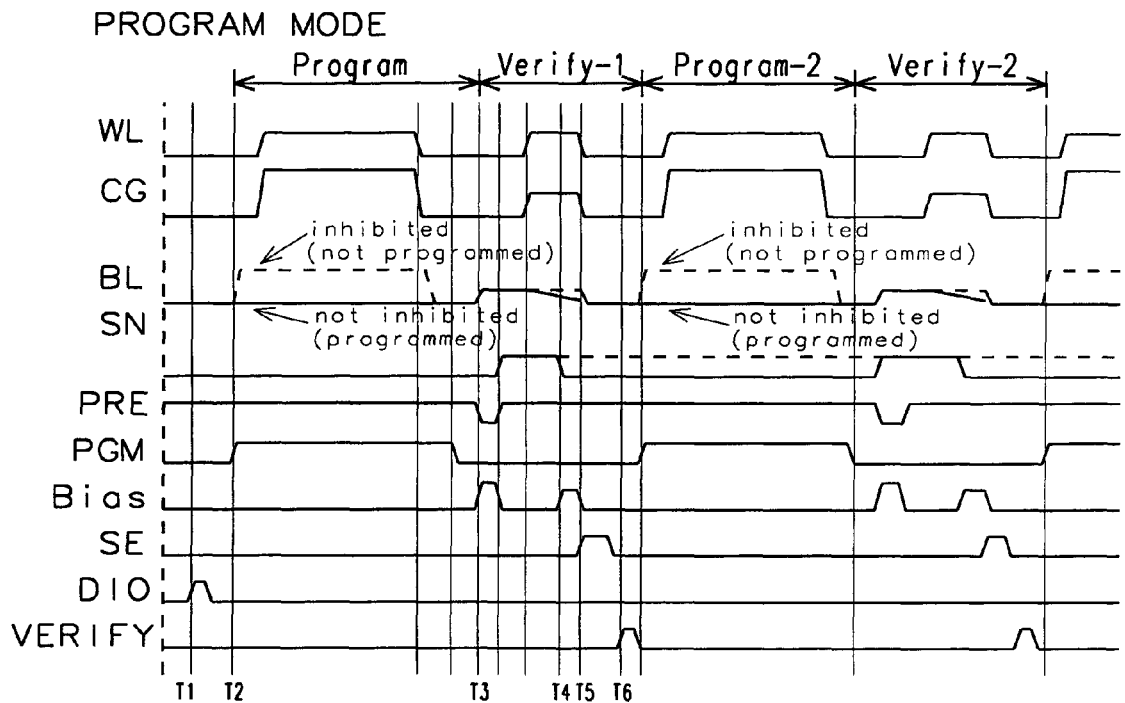
FIG. 45 shows a timing chart explaining how program is performed.

FIG. 45 shows a timing chart explaining how the program operation is performed. The program operation is performed by a series of interleaved program and verify operation cycles. The program operation is started by transmitting a data from the external device to the data latch 100, as shown in T1 of FIG. 45. When the data "0" is written to the selected cell, the signal of "L" level is transmitted to the data latch 100 from the external device. At this time, the node 101 is set in "H" level. When the data "1" is written to the selected cell, the signal of "H" level is transmitted to the data latch 100 and the node 101 is set in "L" level. When the PGM control signal is set in "H" level at T2, the program inhibit circuit 99 produces the power supply voltage, VDD for program inhibition (that is, writing the data "1") or GND for programming (that is, writing the data "0") in accordance with the stored data in the data latch 100. For the memory cells which are supposed to be programmed (writing the data "0"), 4.5V is applied to the selected bit line at the program side and GND voltage is applied to the selected BL at the override side, 5.0V is applied to the selected CG, 3.3V is applied to the override side CG and 1.0V is applied to the selected WL as shown in FIG. 45. This results in the increase of the threshold voltage of the selected cell; that is, writing the data "0" to the memory cell. For the memory cells which are not supposed to be programmed (writing the data "1"), 4.5V is applied to the selected BL's at the program side and VDD voltage is applied to the selected BL at the override side, 5.0V is applied to the selected CG, 3.3V is applied to the override side CG and 1.0V is applied to the selected WL. Because of VDD voltage of the BL at the override, voltage between the word gate and the BL at the override is less than Vth; that is, Vgs is less than Vth. In this situation, the program current doesn't flow. Thus, program is inhibited. This results in the no change of the threshold voltage of the selected memory cell; that is, writing the data "1" to the memory cell. After applying a program voltage to the selected cell, the verify operation is performed in the same way as the read operation. Bias is set in a specified voltage to control the voltage for the selected bit line and the dummy memory cell 97 in T3 and T4. When sensing a read signal of the selected memory cell, sense control signal SE is turned on in the same way as in the read operation. However, the VERIFY signal is set in "H" logic to send the verify result to the chip controller 52 in T6 in FIG. 45. In the following program cycles, the program operation is inhibited for the selected memory cell which is detected as "programmed" (in this case, the output of the sense amplifier 94 DIO is set in "H" level and the node 100 in verify circuit 99 is set in "L"). Because the voltage of the data node DIO in the data latch circuit 100 is set in "H" level and the voltage of the node 98 is set in "L" level, the program inhibit circuit 102 produces the power supply voltage VDD for the override side BL to inhibit program in the next program cycle. Because the node 98 remains at "L" and the sense amplifier 94 is disabled during the program operation, the selected memory cell which should have the data "1" (not programmed) is kept in the program inhibit condition all the time during the program operation. The program operation is not inhibited for the selected memory cells which are detected as "not programmed" in the program verify operation (in this case, the output of the sense amplifier 94 DIO is set in "L" level and the node 100 in verify circuit 99 is set in "H") Because the voltage of the data node DIO in the data latch circuit 100 remains at "L" level and the voltage of the node 98 is set in "H" level, the program inhibit circuit 102 produces ground voltage for the override side BL to program the memory cell (that is, writing the data "0") in the next program cycle. The cycle of program & verify operation continues until all the memory cells which are supposed to be programmed (writing the data "0") are detected as "programmed". The value of the voltages described above may be modified to have another value in the practical application for using the program & verify operation of the present invention. The same is true for the timing of the signals and the time length of the signals.

Figure 46:
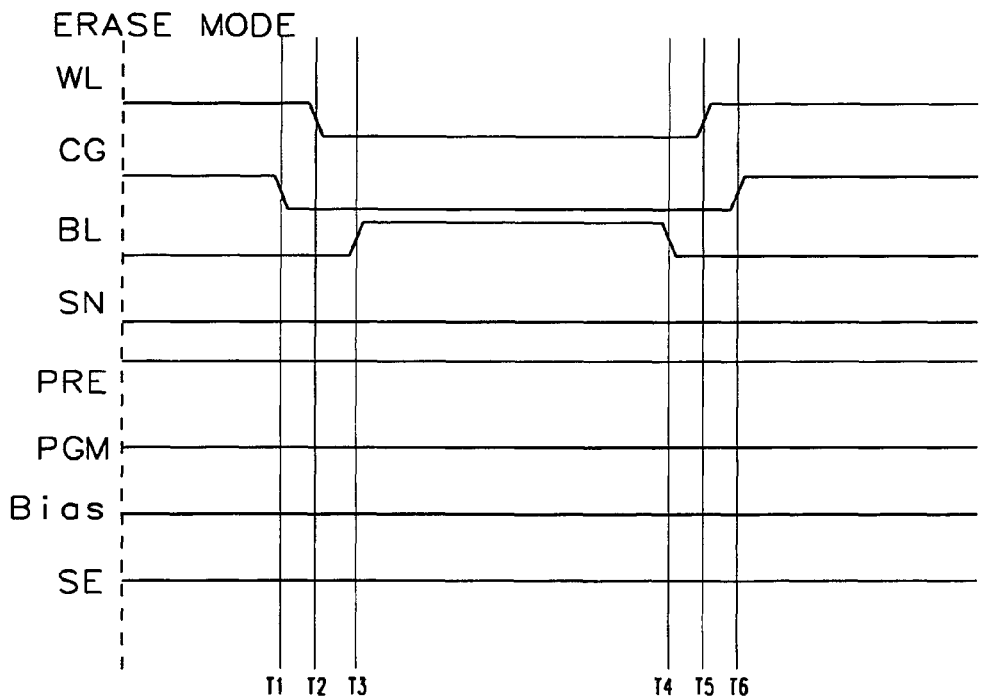
FIG. 46 shows a timing chart explaining how the data is erased from any selected memory cell.

FIG. 46 shows a timing chart explaining how the data is erased from any selected memory cell. The selected CG is set at −3.0V at the read side and the unselected CG is set at 1.8V at the override side. The selected WL is at −2V and the unselected WL is set at 1.8V. The selected BL is set at 4.5V and the unselected BL is set at 0V. In this way, the selected cell is erased. However, the value of the voltages described above may be modified to have another value in the practical application for using the erase operation of the present invention. The same is true for the timing of the signals and the time length of the signals.

It should be understood that the voltages and configurations are given for simplicity of example only, and should not be construed as limiting in any way.

While the invention has been particularly shown and described with reference to the preferred embodiments thereof, it will be understood by those skilled in the art that various changes in form and details may be made without departing from the spirit and scope of the invention.

What is claimed is:

1. A twin MONOS metal bit array operation comprising:
providing a memory array comprising word gates, control gates, and bit lines wherein said control gates run in parallel with said word gates and perpendicular to said bit lines, wherein isolation regions are configured in straight lines in a direction of said bit lines and isolate said bit lines, wherein a pitch of said isolation regions is equal to two pitches of said bit lines;
driving one control gate by one control gate driver circuit or driving several control gates by one control gate driver circuit; and
driving one word gate by one word gate driver circuit.

2. The twin MONOS metal bit array operation according to claim 1 wherein said one control gate driver is connected to two alternate control gates.

3. The twin MONOS metal bit array operation according to claim 1 wherein said one control gate driver is connected to three alternate control gates.

4. The twin MONOS metal bit array operation according to claim 1 wherein said one control gate driver is connected to two or more alternate control gates.

5. The twin MONOS metal bit array operation according to claim 1 wherein said operation comprises read, program, program verify, erase, or erase verify.

* * * * *